United States Patent
Bold et al.

(10) Patent No.: US 10,485,132 B2
(45) Date of Patent: Nov. 19, 2019

(54) RAIL KITS

(71) Applicant: Hewlett Packard Enterprise Development LP, Houston, TX (US)

(72) Inventors: Kevin Peter Bold, Houston, TX (US); James Jeffery Schulze, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/166,705

(22) Filed: May 27, 2016

(65) Prior Publication Data
US 2017/0347480 A1 Nov. 30, 2017

(51) Int. Cl.
| A47B 88/00 | (2017.01) |
| H05K 7/14 | (2006.01) |
| H05K 7/18 | (2006.01) |

(52) U.S. Cl.
CPC ............ *H05K 7/1489* (2013.01); *A47B 88/00* (2013.01); *H05K 7/183* (2013.01)

(58) Field of Classification Search
CPC .... H05K 7/183; H05K 7/1489; A47B 88/042; A47B 88/00
USPC ........ 312/334.7, 333, 334.8, 334.46, 334.44, 312/330.1, 223.1, 265.1, 265.4; 248/27.1, 248/298.1, 316.8, 250; 108/143
See application file for complete search history.

(56) References Cited

U.S. PATENT DOCUMENTS

| 3,133,768 | A | * | 5/1964 | Klakovich | ........... | H05K 7/1421 |
| | | | | | | 312/323 |
| 5,316,389 | A | * | 5/1994 | Hoffman | .............. | A47B 88/493 |
| | | | | | | 384/18 |
| 5,466,060 | A | * | 11/1995 | Hoffman | ............... | A47B 88/493 |
| | | | | | | 312/334.11 |
| 5,577,821 | A | * | 11/1996 | Chu | ...................... | A47B 88/493 |
| | | | | | | 312/330.1 |
| 5,851,059 | A | * | 12/1998 | Cirocco | ............... | A47B 88/493 |
| | | | | | | 312/330.1 |
| 6,224,178 | B1 | * | 5/2001 | Cirocco | ............... | A47B 88/493 |
| | | | | | | 312/334.46 |
| 6,373,707 | B1 | * | 4/2002 | Hutchins | .................. | G06F 1/183 |
| | | | | | | 211/41.17 |
| 6,378,966 | B1 | * | 4/2002 | Baker | ..................... | G06F 1/181 |
| | | | | | | 211/26 |

(Continued)

OTHER PUBLICATIONS

"6.5 Install the Server Into the Rack," Aug. 26, 2009, pp. 1-11, Oracle.

*Primary Examiner* — Nkeisha Smith
(74) *Attorney, Agent, or Firm* — Hewlett Packard Enterprise Patent Department

(57) ABSTRACT

An example rail kit includes a bracket assembly that is attachable to opposing columns of a device rack, a middle rail that is slidably engaged by the bracket assembly, and an inner rail that is connectable to an electronic device and slidably engaged by the middle rail. The rail kit may include a rail lock that is attached to the bracket assembly and that is to, when the inner rail is not engaged by the middle rail and the middle rail is located at a first position that is forward of a fully retracted position, lock the middle rail by engaging a depression in the middle rail such that the middle rail is prevented from sliding rearward. The rail lock may be released as a result of the inner rail being slid toward a retracted position while engaged by the middle rail.

19 Claims, 13 Drawing Sheets

(56) References Cited

U.S. PATENT DOCUMENTS

| | | | | |
|---|---|---|---|---|
| 6,457,790 B1* | 10/2002 | Liang | A47B 88/493 | 312/333 |
| 6,588,866 B2 | 7/2003 | Cheng | | |
| 6,591,997 B2* | 7/2003 | Hung | H05K 7/183 | 211/183 |
| 6,601,713 B2* | 8/2003 | Kaminski | H05K 7/1489 | 211/175 |
| 6,749,275 B2* | 6/2004 | Cutler | A47B 88/43 | 248/243 |
| 6,854,816 B2* | 2/2005 | Milligan | F16C 29/063 | 312/334.11 |
| 6,926,377 B2* | 8/2005 | Lammens | A47B 88/49 | 312/333 |
| 6,929,339 B1* | 8/2005 | Greenwald | H05K 7/1421 | 211/26 |
| 6,962,397 B2* | 11/2005 | Dobler | A47B 88/407 | 312/333 |
| 6,979,067 B2* | 12/2005 | Yang | A47B 88/40 | 312/333 |
| 7,090,319 B2* | 8/2006 | Milligan | A47B 88/493 | 312/334.44 |
| 7,111,913 B2* | 9/2006 | Dubon | A47B 88/49 | 312/333 |
| 7,178,888 B2* | 2/2007 | Judge | H05K 7/1489 | 312/334.44 |
| 7,218,526 B2 | 5/2007 | Mayer | | |
| 7,284,672 B2* | 10/2007 | Tsai | H05K 7/1488 | 211/192 |
| 7,364,244 B2* | 4/2008 | Sandoval | H05K 7/1411 | 312/333 |
| 7,452,040 B1* | 11/2008 | Burgess, III | A47B 88/49 | 312/319.1 |
| 7,571,968 B2* | 8/2009 | Ji | A47B 88/493 | 312/333 |
| 7,604,307 B2* | 10/2009 | Greenwald | A47B 88/49 | 312/333 |
| 7,604,308 B2* | 10/2009 | Tseng | A47B 88/493 | 312/333 |
| 7,677,680 B1* | 3/2010 | Chang | E05C 1/12 | 211/26 |
| 7,780,254 B2* | 8/2010 | Wang | H05K 7/1489 | 108/143 |
| 8,287,059 B2* | 10/2012 | Yang | H05K 7/1489 | 312/333 |
| 8,408,506 B2* | 4/2013 | Yu | H05K 7/1489 | 248/219.1 |
| 8,469,467 B2* | 6/2013 | Chang | H05K 7/1489 | 211/26 |
| 8,474,924 B2* | 7/2013 | Hsu | H05K 7/1489 | 211/26 |
| 8,602,225 B2* | 12/2013 | Lin | H05K 7/1489 | 211/26 |
| 8,967,567 B2* | 3/2015 | Chen | H05K 7/1489 | 211/192 |
| 9,382,943 B2* | 7/2016 | Judge | F16C 29/048 | |
| 9,572,277 B2* | 2/2017 | Chen | H05K 7/1489 | |
| 9,670,956 B2* | 6/2017 | Judge | F16C 29/04 | |
| 2003/0160010 A1* | 8/2003 | Robertson | G11B 33/127 | 211/26 |
| 2004/0012313 A1* | 1/2004 | MacMillan | A47B 88/493 | 312/334.44 |
| 2004/0217073 A1 | 11/2004 | Dobler et al. | | |
| 2006/0163983 A1* | 7/2006 | Wu | A47B 88/493 | 312/333 |
| 2007/0210226 A1* | 9/2007 | Thum | A47F 5/0807 | 248/220.31 |
| 2008/0093958 A1* | 4/2008 | Peterson | H04Q 1/064 | 312/223.1 |
| 2008/0143224 A1* | 6/2008 | Huang | H05K 7/1489 | 312/333 |
| 2008/0211366 A1* | 9/2008 | Brock | A47B 88/467 | 312/333 |
| 2008/0217497 A1* | 9/2008 | Yang | H05K 7/1489 | 248/298.1 |
| 2008/0303398 A1* | 12/2008 | Hsiung | A47B 88/57 | 312/334.46 |
| 2009/0174299 A1* | 7/2009 | Lam | A47B 88/956 | 312/348.4 |
| 2009/0309471 A1* | 12/2009 | Yu | A47B 88/43 | 312/334.44 |
| 2011/0109213 A1* | 5/2011 | Wong | H05K 5/0217 | 312/334.7 |
| 2011/0234072 A1* | 9/2011 | Hightower | A47B 88/43 | 312/334.5 |
| 2012/0145874 A1 | 6/2012 | Eberle et al. | | |
| 2012/0286130 A1* | 11/2012 | Yeh | H02G 3/30 | 248/674 |
| 2014/0265788 A1* | 9/2014 | Judge | H05K 7/1489 | 312/334.1 |
| 2015/0245709 A1* | 9/2015 | Iwamoto | H05K 7/1489 | 211/175 |
| 2016/0029791 A1* | 2/2016 | Chen | H05K 7/1489 | 312/334.44 |
| 2016/0073546 A1* | 3/2016 | Chen | H05K 7/1489 | 361/679.33 |
| 2016/0135325 A1* | 5/2016 | Chen | A47B 96/067 | 312/334.1 |
| 2017/0095078 A1* | 4/2017 | Chen | H05K 7/1489 | |

\* cited by examiner

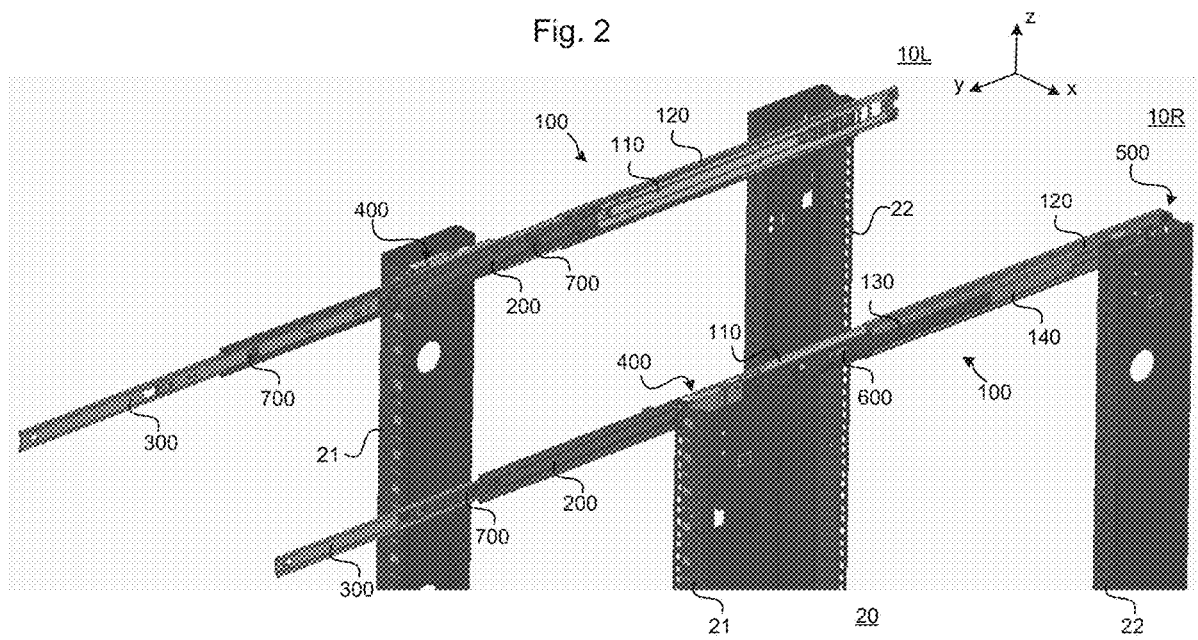

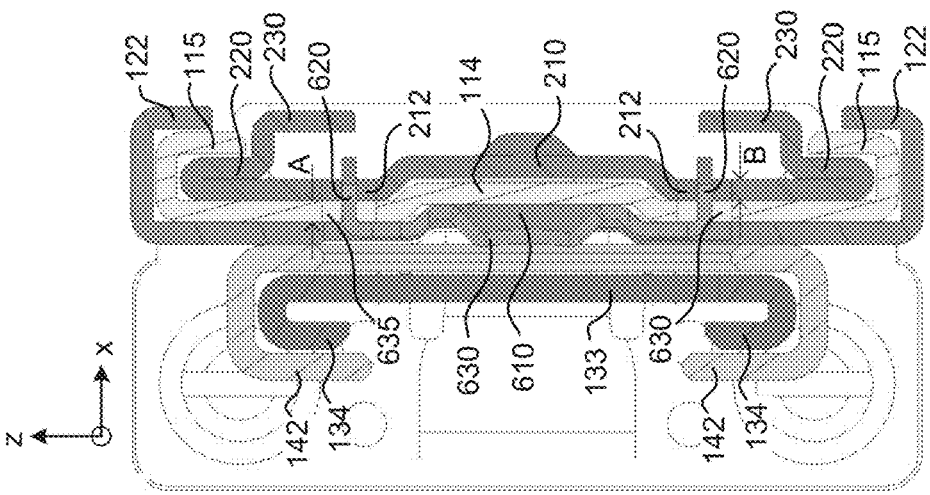
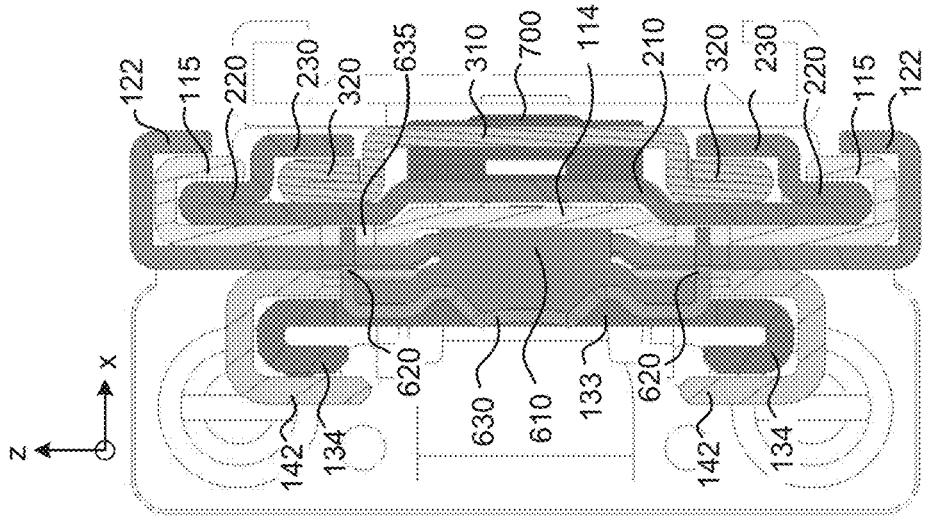
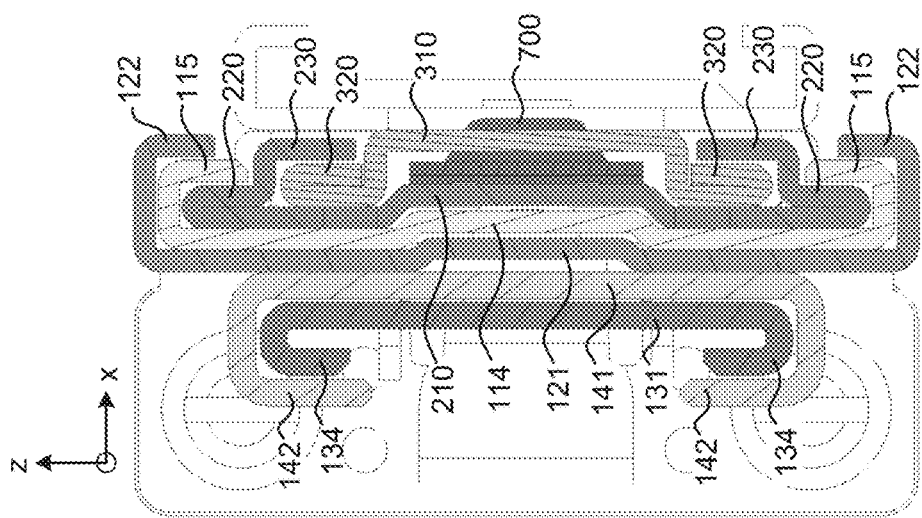

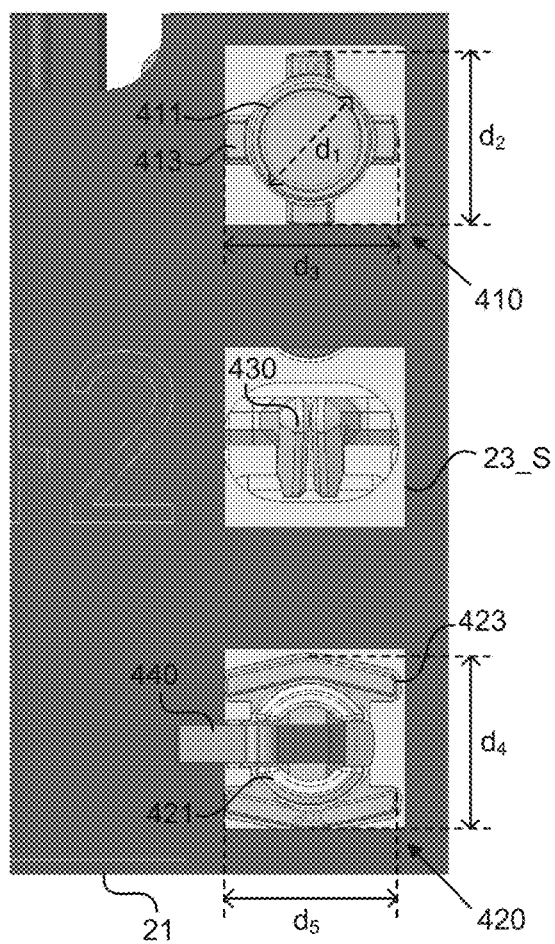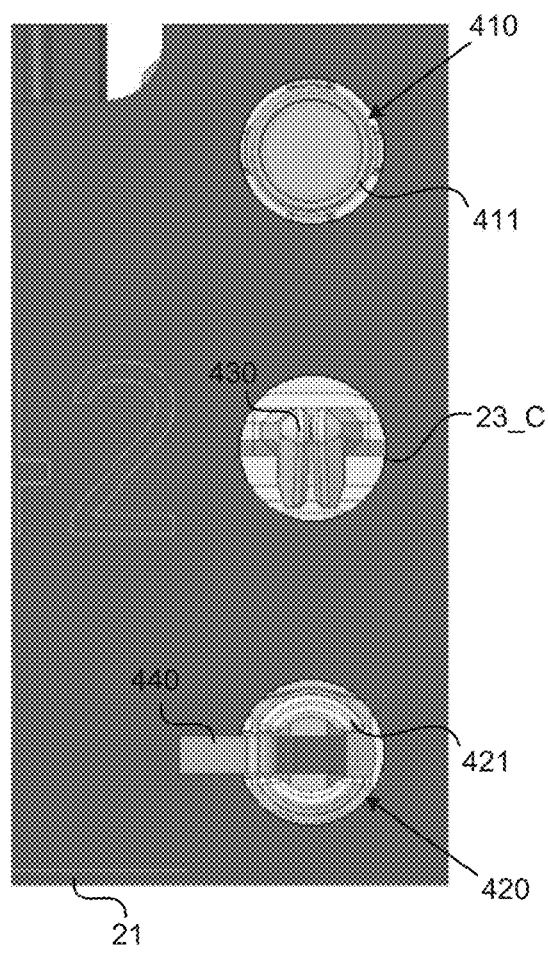

RAIL KITS

BACKGROUND

Device racks (e.g., server racks, storage arrays) are structures for housing multiple electronic devices (e.g., servers, storage devices, etc.). Device racks generally have columns with mounting holes that facilitate mounting of the electronic devices to the device rack. For example, a rail kit may be attached to the mounting holes of the device rack, and the electronic devices may then be connected to a rail of the rail kit, thereby mounting the electronic device to the device rack via the rail kit. The rail kit may allow the electronic device to be slid in and out of the device rack while remaining mounted to the rack, thus providing convenient access for a user to portions of the rail kit that may otherwise be hidden without the need for the user to completely detach the device from the rack.

BRIEF DESCRIPTION OF THE DRAWINGS

FIG. 2 is a perspective view of example rail kits installed in an example device rack with rails in an extended position.

FIG. 7A is a cross-sectional view of an example rail kit taken along the line A in a state in which the inner rail is engaged by the middle rail in a retracted position.

FIG. 7B is a cross-sectional view of an example rail kit taken along the line B in a state in which the inner rail is engaged by the middle rail in a retracted position.

FIG. 7C is a cross-sectional view of an example rail kit taken along the line B in a state in which the middle rail is extended to the first position and the inner rail is not engaged by the middle rail.

FIG. 10A is an elevation view of an example front attachment attached to an example device rack that has square mounting holes.

FIG. 10B is an elevation view of an example front attachment attached to an example device rack that has circular mounting holes.

DETAILED DESCRIPTION

Some electronic devices, such as servers, that are to be mounted to a device rack via a rail kit have a roughly quadrangular shape, and thus have a roughly rectangular profile in a top plan view. For simplicity, these devices will be referred to herein as rectangular devices.

Figure 13A:
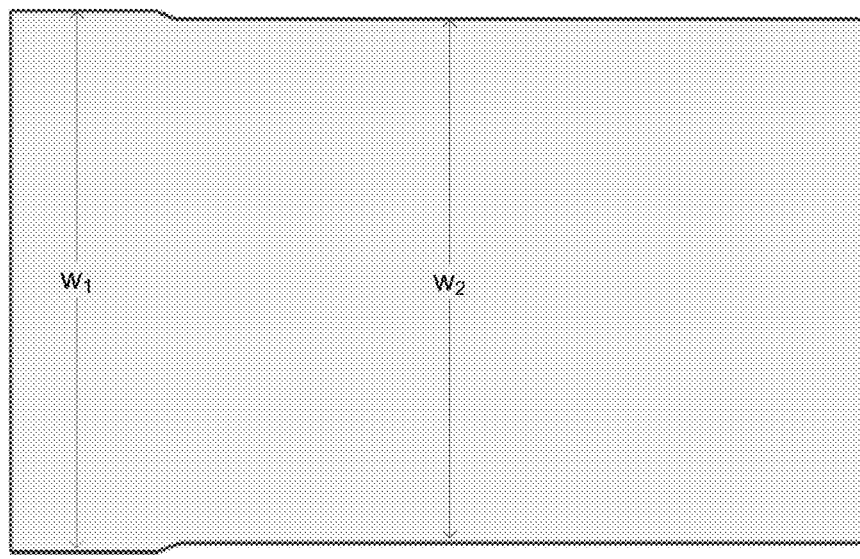
FIG. 13A is a plan view of an example non-rectangular device.
Figure 13B:
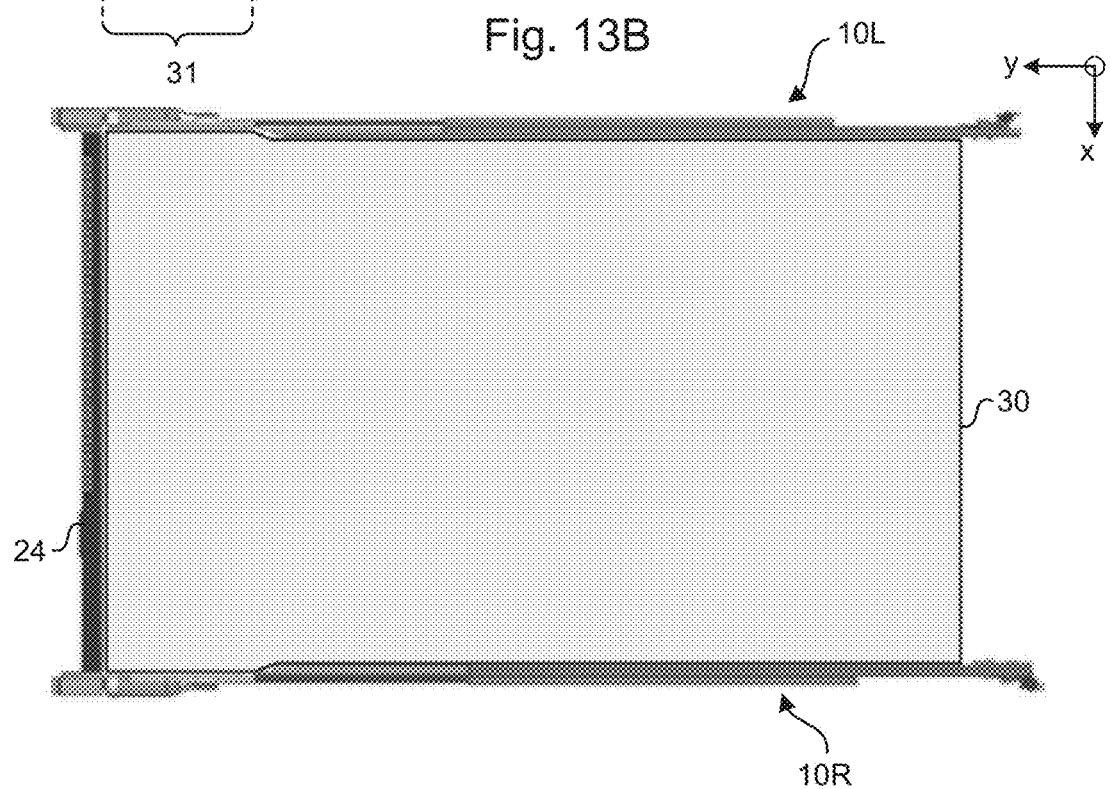
FIG. 13B is a plan view of an example non-rectangular device mounted to two example rail kits.
Figure 13C:
FIG. 13C is a plan view of a portion of an example bracket assembly showing an example of how the bracket assembly may be flared.

Some other devices that are to be mounted to a device rack via a rail kit may have shapes that are different than that of the rectangular devices. For example, certain devices may have shapes that have a non-rectangular profile in a top plan view. For simplicity, these devices will be referred to herein as non-rectangular devices. Example device 30 illustrated in FIGS. 13A and 13B is one example of such a non-rectangular device. In particular, a width $w_1$ of the example device 30 in a flared region 31 near a front end thereof is greater than a width $w_2$ of the example device 30 rearward of the flared region 31, and therefore a profile of the device 30 in a top plan view is non-rectangular.

While there exist certain rail kits that are for mounting rectangular devices to device racks (hereinafter "rectangular rail kits"), generally such rectangular rail kits are not suitable for mounting non-rectangular devices to device racks. For example, non-rectangular devices may have portions that protrude outward relative to other portions along a side of the device that a rail is to be mounted to, and such protruding portions may cause various difficulties such as inability to securely mount a rail of the rectangular rail kit to the non-rectangular device, misalignment of the rail kit with mounting holes of a device rack, and so on. In particular, no existing rail kits are suitable for mounting non-rectangular devices, much less suitable for mounting the specific example of device 30.

In addition, even if there were a rail kit that had a shape/configuration that would accommodate a non-rectangular device, the shape/configuration of such a rail kit might give rise to certain new difficulties. For example, as a result of the shape/configuration of the rail kit, a rail of the rail kit may be obscured from the view of a person attempting to install an electronic device in the rail kit, and hence installation of the device in a device rack may be difficult. As another example, as a result of the shape/configuration of the rail kit, known attachment mechanisms that may have been usable for attaching a rectangular rail kit to the device rack might not be usable for attaching a non-rectangular rail kit to the device rack, as there may be insufficient room for the known attachment mechanism.

Thus, the present disclosure describes examples of new rail kits that may be used to mount non-rectangular devices to a device rack. In addition, certain of the example rail kits described herein may also include certain features that may solve or mitigate one or more of the issues noted above and/or other issues.

[Example Rail Kits—Overview]

Example rail kits may include a bracket assembly (such as the example bracket assembly 100), a middle rail (such as the example middle rail 200), and an inner rail (such as the example inner rail 300). The respective shapes of the bracket assembly, the middle rail, and the inner rail are such that they can accommodate a non-rectangular device (such as the device 30). For example, when the electronic device is flared at its front end, a front portion of the bracket assembly may be flared, which may help provide room to accommodate the flared portion of the device. As another example, the middle rail, the inner rail, and a bracket of the bracket assembly may be shortened such that their respective front ends are located rearward of the point where the device begins to flare, and thus space near a front end of rail kit that would have been taken up by these elements if they were not shortened may now be allocated to help accommodate the increased width of the flared portion of the device.

The bracket assembly may be such that it can be attached to opposing columns of a device rack (such as the example device rack 30), and may be to engage and vertically support the middle rail in such a manner that the middle rail is horizontally slidable relative to the bracket assembly. The middle rail may be such that it can engage the inner rail in such a manner that the inner rail is vertically supported and horizontally slidable relative to the middle rail. The inner rail may be such that it can be connected to an electronic device (such as the example device 30) so as to support the electronic device. In certain examples, the inner rail may be such that it can be removed from the middle rail, which may, for example, facilitate connecting the inner rail to an electronic device.

In certain examples, the rail kit may be installed in a device rack by attaching the bracket assembly to opposing columns of the device rack. For example, in FIGS. 1 and 2, the example rail kits 10L and 1OR are illustrated in an installed state in which they are each attached to opposing columns of the example device rack 20. In general, a pair of rail kits may be needed to mount a single electronic device to a device rack, with the respective rail kits being attached to and supporting opposite sides of the device. For example, in FIG. 13B the example rail kits 10L and 1 OR are attached to the left and right sides, respectively, of the device 30. However, for simplicity of description, certain features may be described herein or illustrated in certain of the Figures with respect to a single rail kit. In such circumstances, it should be understood that similar features as those that are described or illustrated with respect to a single rail kit may also be included in a rail kit that is paired therewith for mounting a device, even if the paired rail kit is not explicitly described or illustrated.

In certain examples, an electronic device may be mounted to the installed rail kit by removing the inner rail from the middle rail (if it has not already been removed), connecting the inner rail to the electronic device, and then inserting the inner rail with its connected electronic device into the middle rail such that the middle rail engages the inner rail. Upon such mounting of the electronic device, the device rack may vertically support the bracket assembly, which may vertically support the middle rail, which may vertically support the inner rail, which may vertically support the electronic device. Moreover, upon such mounting of the electronic device, the electronic device may be slidable horizontally relative to the device rack, since the inner rail may be slidable horizontally relative to the middle rail, which may be slidable horizontally relative to the bracket assembly.

Specific examples of the bracket assembly, the middle rail, and the inner rail (e.g., the example bracket assembly 100, the example middle rail 200, and the example inner rail 300) will be described in greater detail below with respect to FIGS. 1-13.

In certain examples, the rail kits may also include an installation lock (such as the example installation lock 600). The installation lock may be attached to the bracket assembly, and may be to automatically lock the middle rail when both of the following conditions are true: (1) the middle rail is at a first position, and (2) the inner rail is not being engaged by the middle rail (i.e., the inner rail is removed from the middle rail). The first position may be located so as to be advantageous for a process of mounting the device to the rail kit. For example, the first position may be located such that the front end of the middle rail is forward of a front end of the bracket assembly. The aforementioned locking may be accomplished, for example, by automatically engaging a depression in the middle rail so as to lock the middle rail and prevent it from sliding in a retracting direction (in certain examples, the locking does not necessarily prevent sliding in a forward direction). As used herein and in the appended claims, "depression" includes depressions that go partway through a wall as well as depressions that go all the way though the wall (i.e., through-holes). The installation lock may also be such that it is automatically released from locking the middle rail as a result of being contacted by the inner rail as the inner rail is slid rearward while engaged by the middle rail. In other words, the action of installing the inner rail into the middle rail automatically releases the locking of the installation lock. When the inner rail is engaged by the middle rail and located over the depressions in the middle rail, the inner rail may prevent the installation lock from locking the middle rail, even if the middle rail is at the first position.

The installation lock may help solve an issue mentioned above in which a rail is visually obscured during a process of mounting an electronic device. In particular, because the front end of the middle rail in a fully retracted position may be rearward of the front end of the bracket assembly (in order to help accommodate a flared portion of the non-rectangular device), when the rail kit is installed in the device rack the front end of the middle rail may be located rearward of front envelope of the device rack. This recessed location of the front end of the middle rail can make it difficult for a user to see the front end of the middle rail while attempting to mount an electronic device, as the device rack itself and/or other devices that are already installed in the device rack may visually obscure the middle rail. As a result, it may be very difficult for the user who is attempting to mount the electronic device to be able to align the rear end of the inner rail with a front end of the middle rail so as to allow the inner rail to be inserted into and engaged by the middle rail, since the user is essentially blind with respect to the location of the middle rail.

The installation lock helps to solve this issue by locking the middle rail in a position in which it is easier for the user to see the front end of the middle rail throughout the process of attempting to install the inner rail. In particular, the installation lock may lock the middle rail such that its front end is forward of a front end of the bracket assembly, which makes it much easier for the user to see the front end of the middle rail throughout the installation process and thus much easier to successfully guide the inner rail into the middle rail.

Without the locking provided by the installation lock, even if a user were to try to provide visibility of the middle rail by sliding the middle rail forward to the first position in preparation for mounting, the user might still have a difficult time mounting the electronic device since the middle rail, although initially visible at the start of the mounting process, may move out of visibility before mounting is completed. For example, in attempting to insert the inner rail into the middle rail, the middle rail may be inadvertently pushed rearward by the inner rail before the inner rail has been successfully inserted in and engaged by the middle rail, thereby causing the user to lose visibility and thus potentially lose alignment of the inner rail and middle rail, potentially resulting in failure to successfully complete the mounting. These difficulties are further exacerbated by the fact that the user is most likely attempting to simultaneously insert two inner rails from a pair of rail kits into two middle rails, and thus when one or both of the middle rails moves rearward before the inner rails are successfully engaged by the middle rails, the potential for loss of alignment and failure of installation is increased. On the other hand, the locking provided by the installation lock ensures that the front end of the middle rail is visible not only at the beginning of the mounting process, but also that it remains visible until the inner rail has been successfully engaged by the middle rail, since the middle rail is prevented from moving rearward during the installation process.

Because the installation lock may be automatically released as a result of the user pushing the electronic device into the device rack, a user does not have to manually perform some additional operation to release the lock (e.g., pushing a release button), and thus the presence of the installation lock does not increase the complexity of the installation process.

Figure 4A:
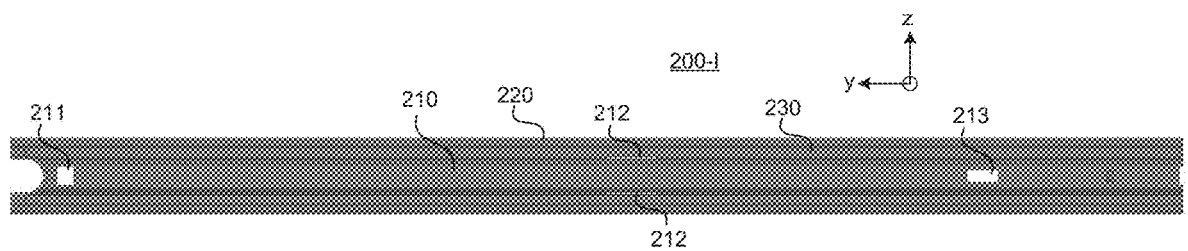
FIG. 4A is an elevation view of an inward facing side of an example middle rail.
Figure 4B:
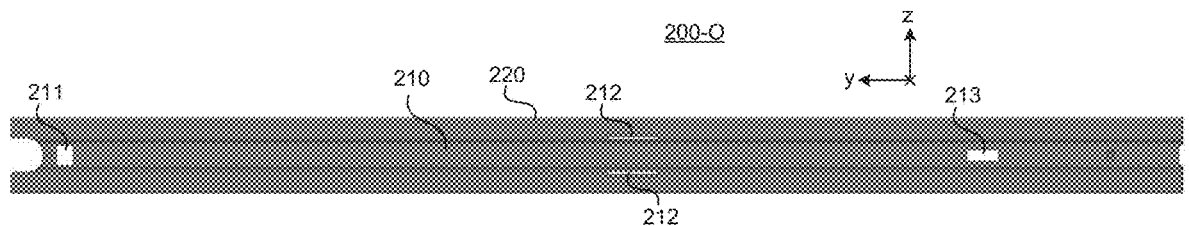
FIG. 4B is an elevation view of an outward facing side of an example middle rail.
Figure 5A:
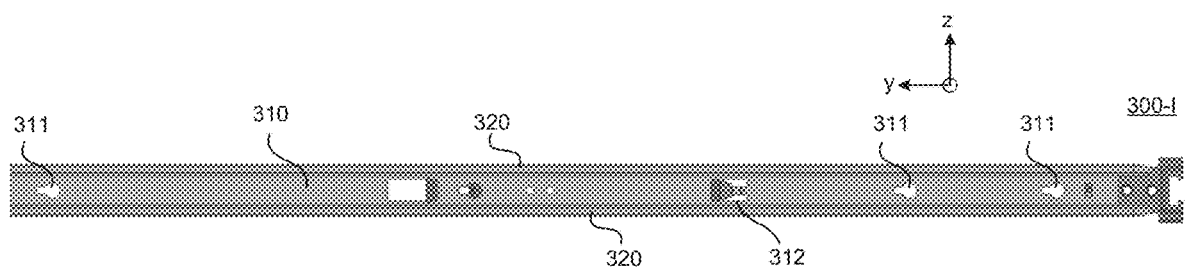
FIG. 5A is an elevation view of an inward facing side of an example inner rail.
Figure 5B:
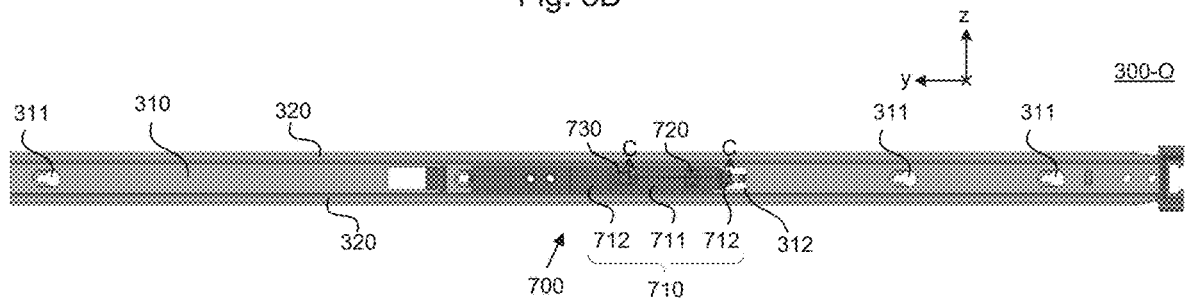
FIG. 5B is an elevation view of an outward facing side of an example inner rail.
Figure 6A:
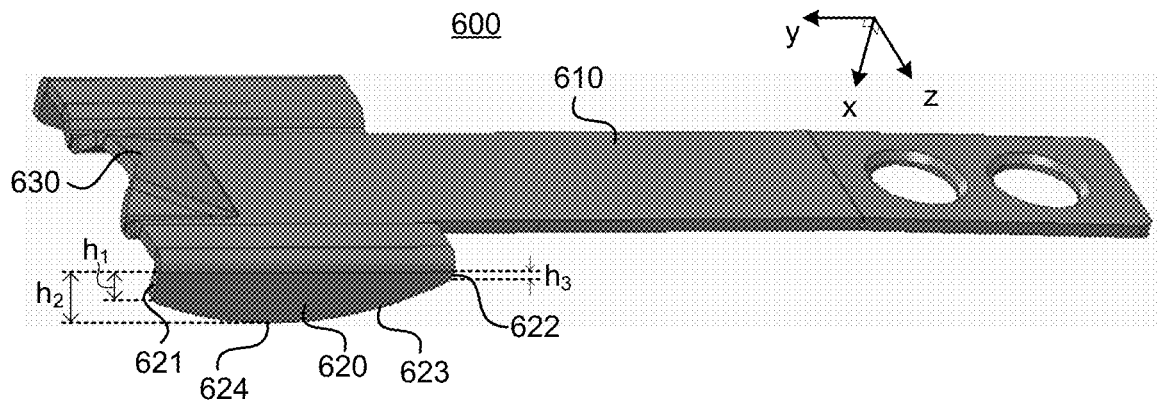
FIG. 6A is a perspective view of an example installation lock.
Figure 6B:
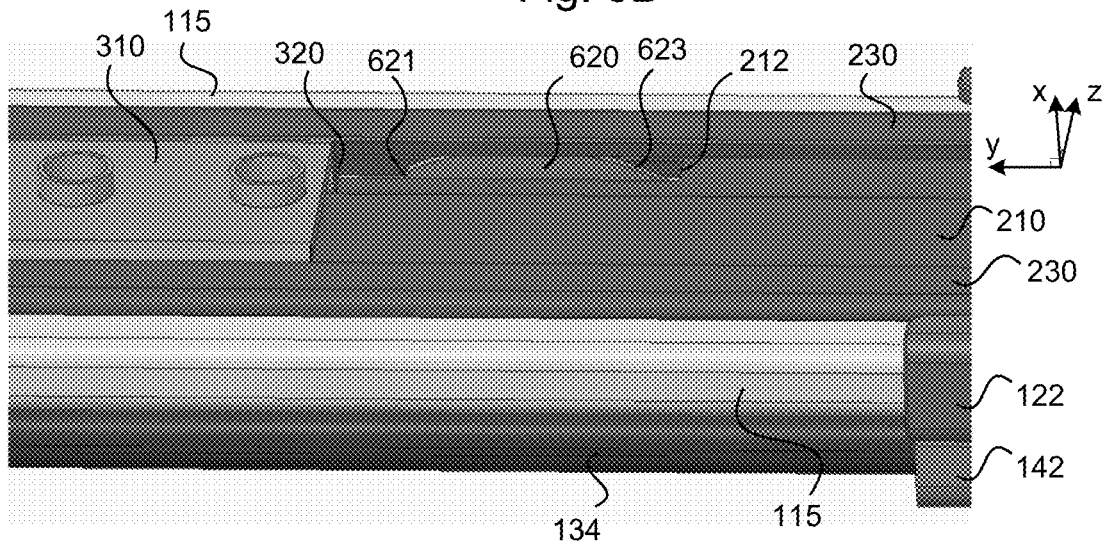
FIG. 6B is a perspective view of a portion of an example rail kit in a state in which an example installation lock is locking the middle rail.

Specific examples of the installation lock (e.g., the example installation lock 600) will be described in greater detail below with reference to FIGS. 1-13. In particular, FIGS. 6A-6B illustrate the example installation lock 600 in detail.

The example rail kits may also include a front attachment mechanism (such as the example front attachment 400), which may be to attach a front end of the rail kit to a front column of a device rack. The front attachment mechanism may include alignment pins (such as the example top alignment pin 410 and the example bottom alignment pin 420), which are to couple with mounting holes in the column of the device rack.

The shapes of mounting holes in device racks may differ from device rack to device rack, and therefore the alignment pins of the front attachment mechanism may be configured to couple with multiple shapes of mounting holes. For example, many server racks comply with the Electronic Industries Association (EIA) 310-D industry standard, which specifies mounting holes to be circular or square. In particular, a top alignment pin may include a first coupler (such as the example first coupler 411) that may be to couple with a circular mounting hole, and a second coupler (such as the example second coupler 413) that may be to couple with a square mounting hole. In addition, the bottom alignment pin may include a third coupler (such as the example third coupler 421) that may be to couple with a circular mounting hole, and a fourth coupler (such as the example fourth coupler 423) that may be couple with a square mounting hole.

The first coupler may extend horizontally forward from a front face of the bracket assembly, and have a cross-sectional exterior profile that is circular. A diameter or the first coupler may be such that it can couple with the circular mounting hole. For example, a diameter $d_1$ of the example first coupler 411 illustrated in FIG. 10A may be 6.4 mm<$d_1$<7.2 mm, which may allow the example first coupler 411 to couple with a standard circular mounting hole specified by EIA 310-D. In certain examples, the first coupler may have a hollowed out portion along its axis, which may be threaded to receive a screw, such as a screw that may be used to help secure the rail kit to the rack.

The second coupler may extend horizontally forward from a front face of the bracket assembly, surround the first coupler, and slide horizontally relative to the first coupler between an extended position and a retracted position. The second coupler may be spring biased toward the extended position. In particular, the second coupler may include multiple portions at a forward end thereof that surround the first coupler on various sides thereof. The portions of the second coupler may be separated from one another at a forward end of the second couple, and may be connected to one another at a rearward end thereof. For example, the second coupler may include a portion on each of the top, bottom, left, and right sides of the first coupler that are to couple with top, bottom, left, and right sides, respectively, of a square mounting hole. For example, a distance between a top of the top portion and bottom of the bottom portion of the example second coupler 413, illustrated as $d_2$ in FIG. 10A, may be 8.0 mm<$d_2$<9.5 mm. In certain examples, a distance between a side of the left portion and an opposite side of the right portion of the example second coupler 413, illustrated as $d_3$ in FIG. 10A, may be 8.0 mm<$d_3$<9.5 mm. The second coupler may include guide forms that are to engage guide groves in a housing that holds a rear portion of the second coupler, which are to help prevent binding of the second coupler as it is moved between the extended and retracted positions.

Thus, when the mounting hole is square the second coupler may remain in the extended position and couple with the mounting hole, whereas when the mounting hole is circular the second coupler may be depressed by the edges of the mounting hole into the retracted position and thereby allow the first coupler to couple with the mounting hole.

The third coupler may be similar to the first coupler of the top alignment pin, in certain respects, and thus detailed description of certain features thereof is omitted. The third coupler may differ from the first coupler in that it may have a rack lock (such as the example rack lock 440) extending generally horizontally through the center of the third coupler. In addition, the third coupler may have a gap on a side such that the rack lock may be moved into the gap so as to hook a side of the mounting hole.

The fourth coupler may be similar to the second coupler of the top alignment pin, in certain respects, and thus detailed description of certain features thereof is omitted. The fourth coupler may differ from the second coupler in that the portions of the fourth coupler that are on various sides of the third coupler may have a different arrangement than the portions of the second coupler. In particular, there might be no portion of the fourth coupler provided on a side of the third coupler that has the gap for the rack lock, in order to avoid inhibiting the rack lock's movement. For example, the fourth coupler may have two portions on opposing sides of the third coupler, such as a top portion on a top side of the third coupler and a bottom portion on a bottom side of the third coupler. The two portions of the fourth coupler may be, for example, concave such that the apexes thereof couple with top and bottom sides of a square mounting hole and left and right sides thereof couple with left and right sides of the square mounting hole. For example, a distance between the apexes may be equal to a width of each of the two portions. For example, in FIG. 10A a distance between the apexes of the top and bottom portions of the example fourth coupler 423 is shown as $d_4$ and a width of the bottom portion is shown as $d_5$, and in certain examples 8.0 mm<$d_4$<9.5 mm and 8.0 mm $d_5$<9.5 mm.

The rack lock may be to lock the front end of the bracket assembly to the device rack when the alignment pins are coupled with the mounting holes. In particular, the rack lock may include a hook that engages a side of one of the mounting holes so as to constrain horizontal movement of the bracket assembly, while the alignment pins constrain vertical movement of the bracket assembly. The rack lock may be moveable between an unlocked position in which it does not engage the side of the mounting hole, and a locked position in which it does engage the side of the mounting hole. The rack lock may be spring biased toward the locked position, and may include a release button that may be pressed to move the rack lock toward the unlocked position.

The release button may be accessible by a user through a hole in a side of the bracket assembly. The hole may include a finger catch that is designed so as to engage the user's finger as the finger presses the release button, thereby providing something for the user to pull against in a horizontal direction while the user is depressing the button. This may make it easier for a user to detach the bracket assembly with a single hand, since the user may be able to pull the bracket assembly free from the device rack with one hand while simultaneously depressing the button with the same hand.

The front attachment mechanism may also include a cover latch (such as the example cover latch 430). The cover latch may extend horizontally from the front face of the bracket assembly, and may be located between the top alignment pin and the bottom alignment pin. When the rail kit is installed in the device rack, the cover latch may extend through one of the mounting holes and may form part of a latching mechanism that latches a cover plate that may be installed across a front opening of the device rack over the installed electrical device in order to prevent the electrical device from sliding horizontally.

Specific examples of the front attachment mechanism (e.g., the example front attachment 400) will be described in greater detail below with reference to FIGS. 1-13. In particular, FIGS. 8-11B show the example front attachment 400 in detail.

The example rail kits may also include an extended rail lock (such as the example extended rail lock 700), which may be to automatically lock the inner rail from moving horizontally when the inner rail is in a fully extended position. In particular, the extended rail lock prevents the inner rail from moving rearward in addition to locking the inner rail from moving forward. The extended rail lock may be connected to the inner rail, and may lock the inner rail relative to the middle rail by engaging a depression in the middle rail.

Specifically, when the inner rail is extended forward, the extended rail lock automatically locks once the inner rail reaches a fully extended position so as to prevent any further movement forward or rearward. Preventing further forward movement prevents the inner rail from unintentionally being released from the rail kit. Preventing further rearward movement may make it easier and safer for a user to work on a mounted electronic device that has been slid out from the device rack, since the electronic device cannot unintentionally slide back into the device rack while it is being worked on.

Figure 12A:
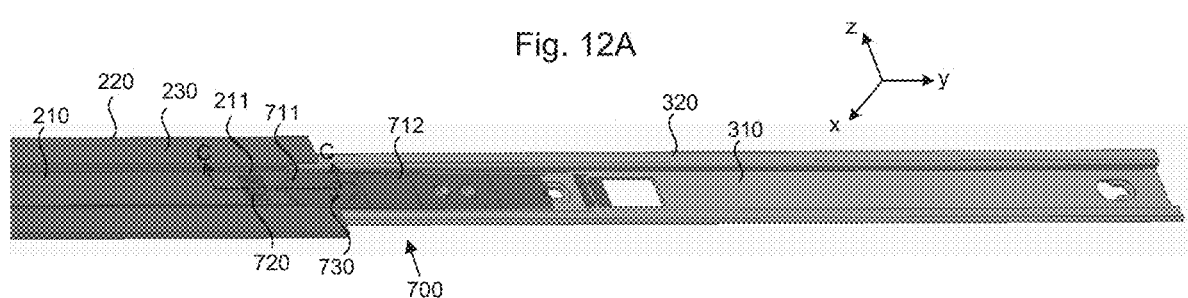
FIG. 12A is a perspective view of an example extended lock in a state in which the inner rail is in a fully extended position and the extended lock is locking the inner rail relative to the middle rail.
Figure 12B:
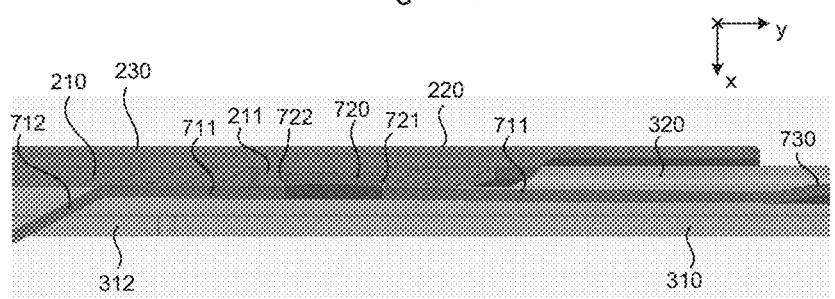
FIG. 12B is a cross-sectional view of an example extended lock taken along the line C in a state in which the inner rail is in a fully extended position and the extended lock is locking the inner rail relative to the middle rail.

Specific examples of the extended rail lock (e.g., the example extended rail lock 700) will be described in greater detail below with reference to FIGS. 1-13. In particular, FIGS. 5B, 12A, and 12B illustrate the example extended rail lock 700 in detail.

The example rail kits may also include a second extended rail lock (such as the example second extended rail lock 800), which may be to automatically lock the middle rail from moving horizontally when the middle rail is in a fully extended position. In particular, the second extended rail lock may lock the middle rail from moving rearward in addition to locking the middle rail from moving forward. The second extended rail lock may be connected to the bracket assembly, and may lock the middle rail relative to the bracket assembly by engaging a depression in the middle rail. Locking the middle rail from moving in both the forward and the rearward directions may provide benefits that are similar to the benefits described above with respect to the extended rail lock locking the inner rail.

Figure 3A:
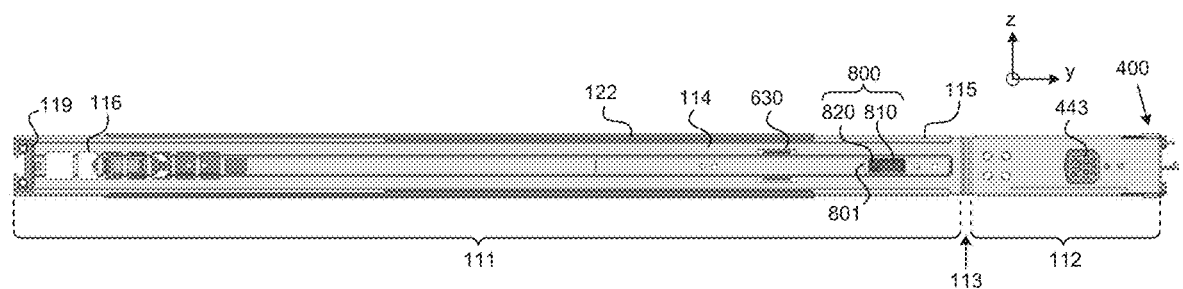
FIG. 3A is an elevation view of an inward facing side of an example bracket assembly.
Figure 3B:
FIG. 3B is an elevation view of an outward facing side of an example bracket assembly.

Specific examples of the second extended rail lock (e.g., the example second extended rail lock 800) will be described in greater detail below with reference to FIGS. 1-13. In particular, FIGS. 3A and 3B show details of the second extended rail lock 800.

Various example rail kits and various example features were described above. One of these example rail kits, namely example rail kit 10, will be described in greater detail below with reference to FIGS. 1-13. The example rail kit 10 happens to include specific examples of each of the features described above; however, this should not be interpreted to imply that each example rail kit described herein must include all of these features. In particular, it should be understood that the example rail kits described herein include rail kits having any and all possible combinations or permutations of the features described above.

[Detailed Example of a Rail Kit]

Figure 1:
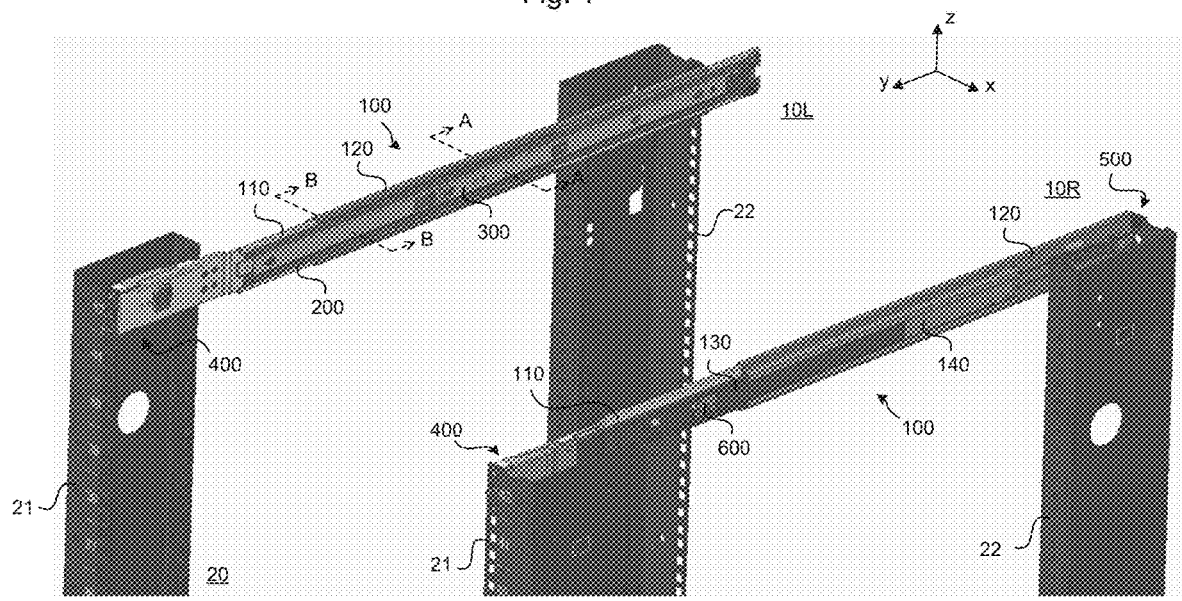
FIG. 1 is a perspective view of example rail kits installed in an example device rack with rails in a retracted position.

The example rail kit 10 may include a bracket assembly 100, a middle rail 200, an inner rail 300, a front attachment 400, a rear attachment 500, an installation lock 600, an extended rail lock 700, and a second extended rail lock 800. FIGS. 1 and 2 illustrate the example rail kit 10 in a state in which it is installed in in a device rack 20 in retracted and fully extended positions, respectively. FIG. 7A illustrates a cross-section of the example rail kit 10 along the line A, while FIGS. 7B and 7C illustrate cross-sections of the example rail kit 10 along the B in various states.

The bracket assembly 100 may include a front bracket 110, a rear bracket 120, a front support 130, and a rear support 140. The front attachment 400 and the rear attachment 500 may also be considered as being part of the bracket assembly 100, but will be described separately for ease of understanding. The overall structure of the bracket assembly 100 is visible in the views of the overall rail kit that are shown in FIGS. 1, 2, and 7A-7C. Additional details of the bracket assembly 100 are illustrated in FIGS. 3A and 3B, in which the front support 130, rear support 140, middle rail 200, and inner rail 300 are omitted for clarity.

The bracket assembly 100 may be flared so as to accommodate a shape of a non-rectangular device, such as the device 30. In particular, as used herein and in the appended claims, the bracket assembly 100 is "flared" if an inward-most part of the bracket assembly 100 in a forward portion 112 thereof is offset by and amount δ>0 in an outward direction from inward most part of the bracket assembly 100 in a rearward portion 111 of the bracket assembly 100 (see, for example, FIG. 13C). In certain examples, the offset amount δ may be greater than or equal to 6.4 mm. For example, when the example rail kit 10 is to mount the example device 30, then the offset δ may be set such that $\delta \geq \frac{1}{2}(w_1 - w_2)$, where $w_1$ is a width of a flared portion 31 of the device 30 and $w_2$ is a width of a rear portion of the device 30, as illustrated in FIG. 13A. For example, the bracket assembly 100 may be flared as a result of the front bracket 110 being bent such that a front portion 112 is offset relative to a rear portion 112, as a result of the middle rail 200 and inner rail 300 having their respective front ends truncated rearward of a front end of the bracket assembly 100, or as a result of a combination of the forgoing.

The front bracket 110 may be to connect the bracket assembly 100 to a front column 21 of the device rack 30 via the front attachment 400, as well as to engage the middle rail 200. A forward portion 112 of the front bracket 110 corresponds to a flared portion of the bracket assembly 100. The front bracket 110 may have a side wall 114 that extends horizontally throughout a rearward portion 111 thereof, then extends obliquely in a transitional portion 113, and then extends horizontally throughout the forward portion 112. Thus, the side wall 114 in the forward portion 112 may be offset from the side wall 114 in the rearward portion 111. The side wall 114 may be generally planar in shape, and may include a central ridge in certain areas for increased strength as well as to house various elements, such as portions of the installation lock 600 and the second extended rail lock 800. The front bracket 110 may also have guides 115, which define grooves in which flanges 220 of the middle rail 200 may be inserted (see, for example, FIGS. 3A and 7A-7B). The guides 115 are to engage the flanges 220 of the middle rail 200 so as to vertically support the middle rail 200 while allowing the middle rail 200 to slide horizontally. The front bracket 110 may also include holes 116 that may be used in conjunction with a length adjustment lock 123 to adjust the length of the bracket assembly 100, as well as holes 635 that allow locking protrusions 620 of the installation lock 600 to pass through. The front bracket 110 may also include a front wall 117, and an opposing wall 118 that faces the side wall 114. The front bracket 110 may also include a backstop 119, which may be to prevent the middle rail 200 from sliding rearward beyond a fully retracted position.

The rear bracket 120 may be to connect the bracket assembly 100 to a rear column 22 of the device rack 30 via a rear attachment 500. The rear bracket 120 has a side wall 121, and guides 122. The guides 122 define grooves in which the guides 114 of the front bracket 110 may be inserted (see, for example, FIGS. 3A and 7A-7B). The rear bracket 120 may also include the length adjustment lock 123, which may engage one of the holes 116 in the front bracket 110 (see, for example, FIG. 3B). By adjusting which hole 116 the length adjustment lock 123 engages, the length of the bracket assembly 100 may be adjusted.

The front support 130 may include a side wall 131, an access hole 133, and a flange 134. The front support 130 may be for adding strength to the bracket assembly 100. The access holes 133 may be to provide access to the installation lock 600.

The rear support 140 may include a side wall 141 and guides 142. The guides 142 may receive the flange 134 of the front support 130. The rear support 140 may be for adding strength to the bracket assembly 100.

The middle rail 200 may have a side wall 210, flanges 220, and guides 230. The middle rail 200 may be seen in its installed state in FIGS. 1, 2, and 7A-70. Additional details of the middle rail 200 are illustrated in FIGS. 4A and 4B, in which the middle rail 200 is shown separately from other features of the rail kit 10 for clarity. The side wall 210 may be generally planar, with a raised central ridge for added strength and to accommodate a central ridge of the front bracket 110. The side wall 210 may include a first depression 211, a second depression 212, and a third depression 213. The first depression 211 may be shaped to receive the locking protrusion 720 of the extended rail lock 700, and located such that the extended rail lock 700 engages therewith when the inner rail 300 is at an extended position relative to the middle rail 200. The second depression 212 may be shaped to receive the locking protrusion 620 of the installation lock 600, and located such that the installation lock 600 engages therewith when the middle rail 200 is at the first position described above. In particular, the first position may be such that the front end of the middle rail 300 is forward of the front end of the bracket assembly 100. The third depression 213 may be shaped to receive the locking protrusion 820 of the second extended rail lock 800, and located such that the second extended rail lock 800 engages therewith when the middle rail 200 is at an extended position relative to the bracket assembly 100. The guides 230 define grooves in which flanges 320 of the inner rail 300 may be inserted. The guides 230 are to engage the flanges 320 of the inner rail 300 so as to vertically support the inner rail 300 while allowing the inner rail 300 to slide horizontally.

Although the first through third depressions 211-213 were referred to in the singular above, it should be understood that there could be more than one instance of each such depression 211-213, and each instance of the depressions 211-213 may be to receive a corresponding instance of the locking protrusions 720, 620, 811. For example, FIGS. 1-13 illustrate there being one first depression 211, two second depressions 212, and one third depression 213, but this is merely one possible example.

The inner rail 300 has a side wall 310 and flanges 320. The inner rail 300 may be seen in its installed state in FIGS. 1, 2, 7A and 7B. Additional details of the inner rail 300 are illustrated in FIGS. 5A and 5B, in which the inner rail 300 is shown separately from other features of the rail kit 10 for clarity. The side wall 310 may be generally planar, with a raised central ridge for added strength, to allow room for the extended rail lock 700, and to accommodate a central ridge of the middle rail 200. The side wall 310 may include means for attaching to an electronic device, such as the device 30. For example, the side wall 310 may have holes 311, which may, for example, receive screws, rivets, or other mechanical fasteners to attach the inner rail 300 to the device 30. Other examples of means for attaching the inner rail 300 to an electronic device include clips, latches, friction bindings, adhesives, and so on.

The front attachment 400 may include top alignment pin 410, bottom alignment pin 420, cover latch 430, rack lock 440, pin housing 450, and lock housing 460. The overall structure of the front attachment 400 is visible in the views of the overall rail kit that are shown in FIGS. 1-3. Additional details of the front attachment 400 are illustrated in FIGS. 8-11B, in which the front attachment 400 is shown separate from other features of the rail kit 10 for clarity.

The top alignment pin 410 may include a first coupler 411, which may be to couple with a circular mounting hole 23_C, and a second coupler 413, which may be to couple with a square mounting hole 23_S. In particular, when the mounting hole 23 is square the second coupler 413 may couple with the mounting hole 23_S (see FIG. 10A), whereas when the mounting hole 23 is circular the second coupler 413 may be depressed by the edges of the mounting hole 23 into the retracted position and thereby allow the first coupler 411 to couple with the mounting hole 23_C (see FIG. 10B).

Figure 8:
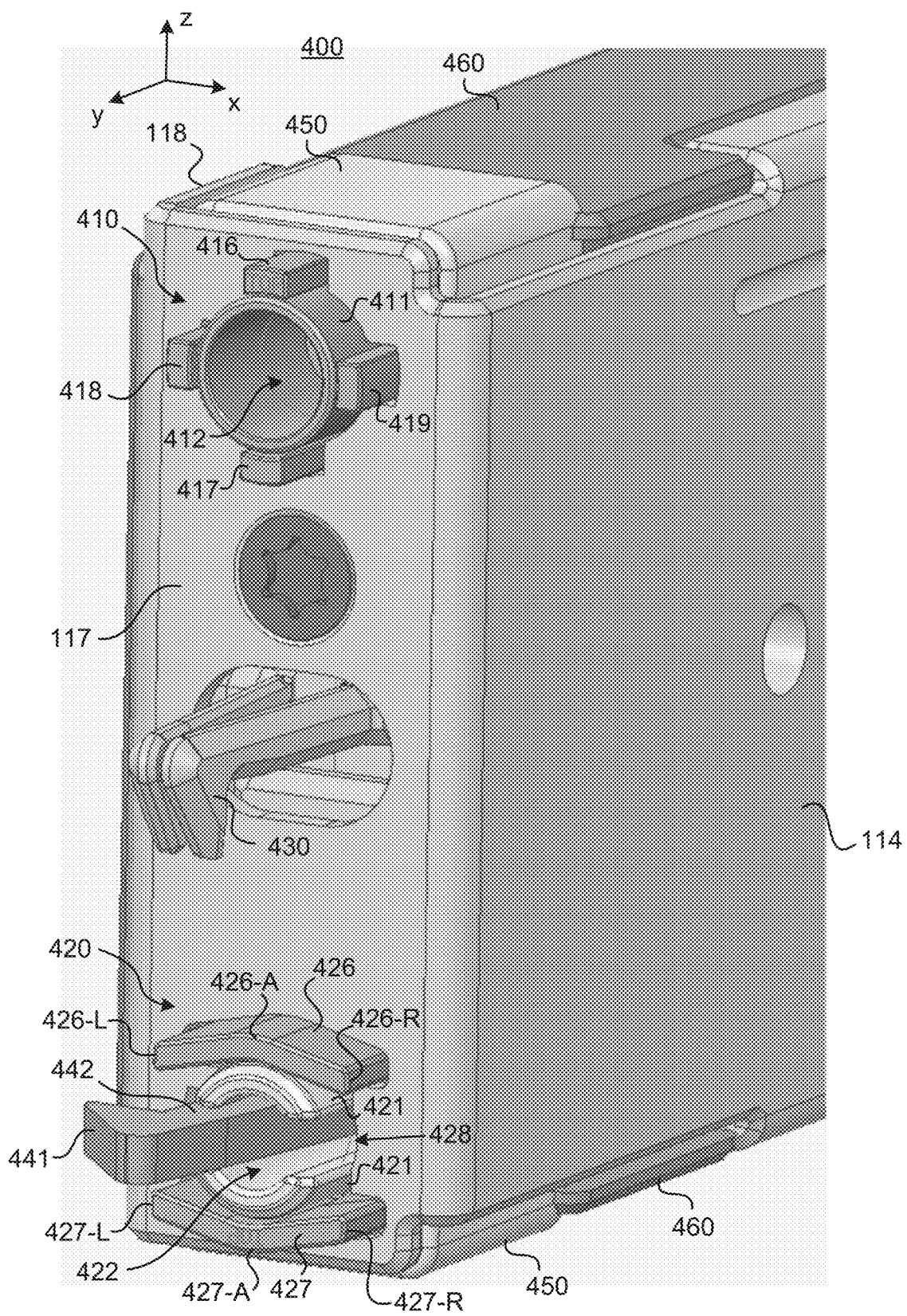
FIG. 8 is perspective view of an example front attachment.
Figure 9A:
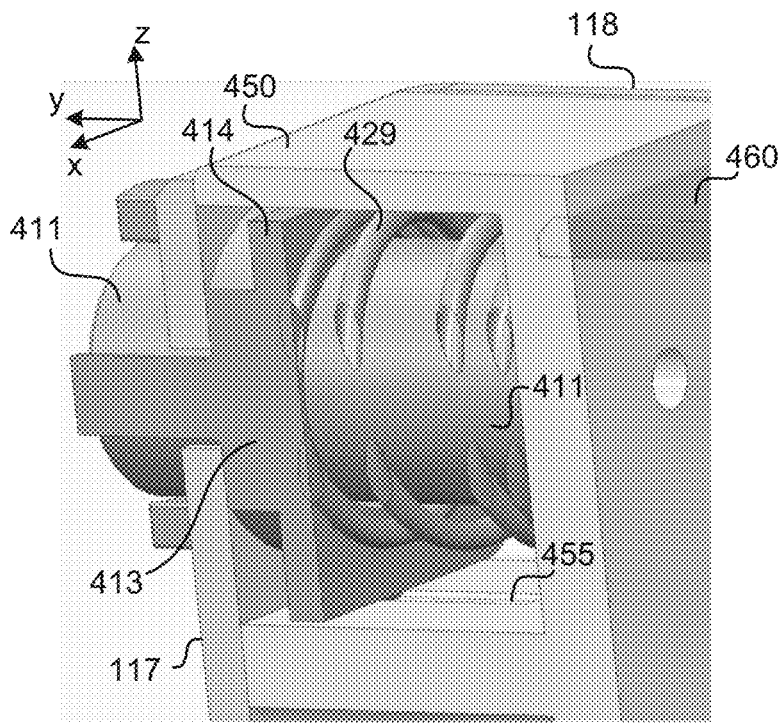
FIG. 9A is a perspective view of an example top alignment pin and pin housing with portions cut away to show features located within the pin housing.
Figure 9B:
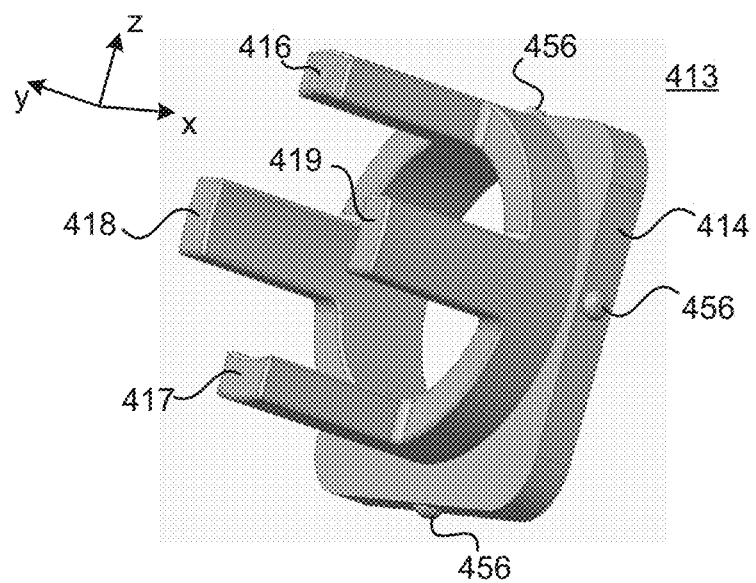
FIG. 9B is a perspective view of an example first coupler.
Figure 11A:
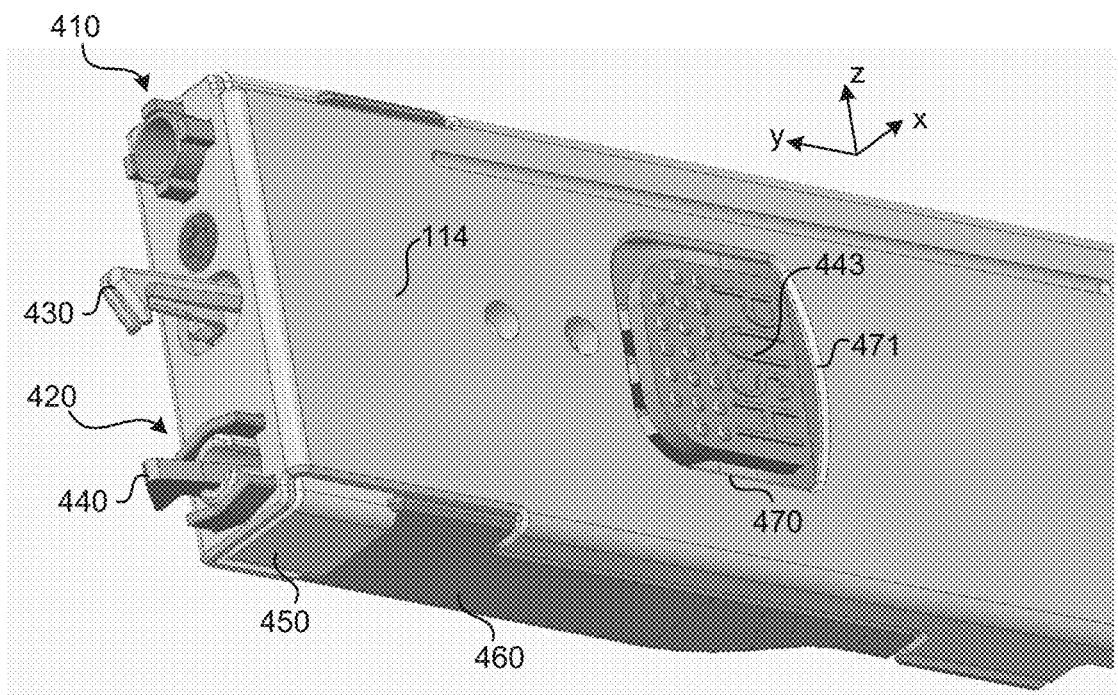
FIG. 11A is a perspective view of an example front attachment mechanism with an example rack lock.
Figure 11B:
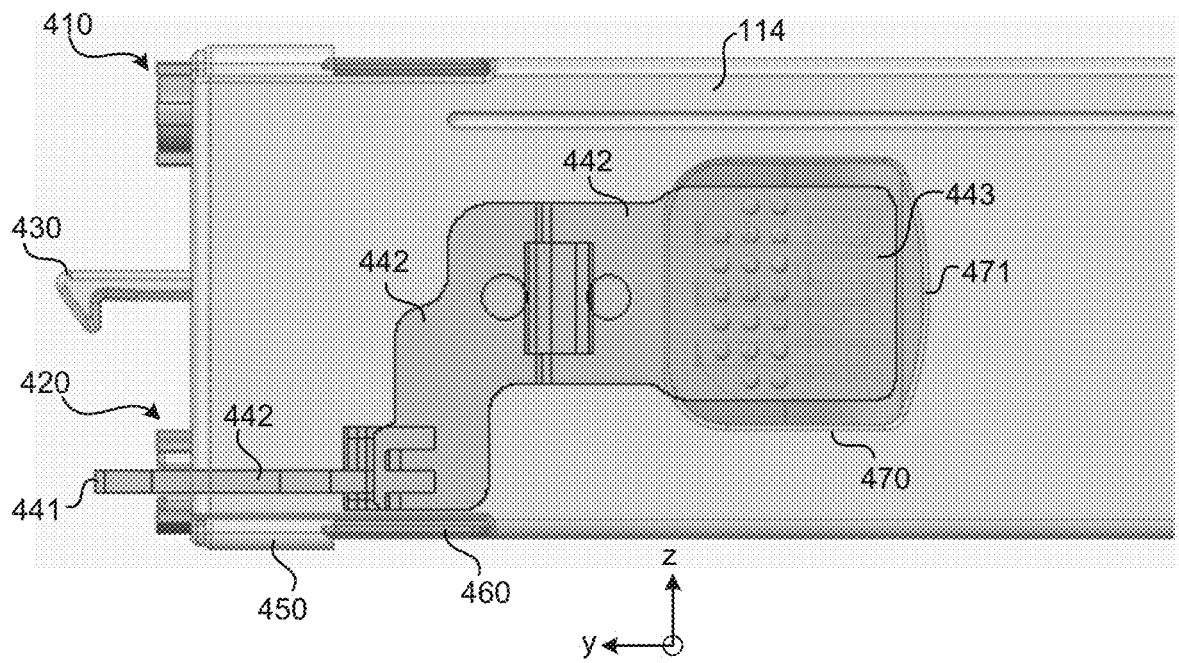
FIG. 11B is an elevation view of an example front attachment mechanism with an example rack lock, in which a portion of a side wall has been made transparent to show portions of the rack lock located within a lock housing and a pin housing.

The first coupler 411 may extend horizontally forward from within a chamber defined by the pin housing 450 and the front wall 117 out of the front wall 117, and have a cross-sectional exterior profile that is circular (see FIGS. 8-9A). The first coupler 411 has a hollowed out portion 412 along its axis, which may be threaded to receive a screw, such as a screw that may be used to help secure the rail kit to the rack.

The second coupler 413 may include a base portion 414, which surrounds the first coupler 411 and is housed in the chamber defined by the pin housing 450 (see FIG. 9A). The second coupler 413 also may include a first portion 416, a second portion 417, a third portion 418, and a fourth portion 419, that extend horizontally forward from the base portion 414 out of the front wall 117 (see FIGS. 8-9B). The first through fourth portions 416-419 are located on the top, bottom, left, and right sides of the first coupler 411, respectively, and are to couple with top, bottom, left, and right sides of a square mounting hole 23_S, respectively (see FIGS. 8 and 10A). The second coupler 413 may be to slide horizontally relative to the first coupler 411 between an extended position and a retracted position, the second coupler 413 being spring biased by the spring 429 toward the extended position (see FIG. 9A). Although the spring 429 is illustrated as a coiled spring, it should be understood that any other type of spring could be used, such as a flat spring, a machined spring, a serpentine spring, etc. The spring 429 could be integral with the base portion 414, or it could be a separate piece from the base portion 414. The base portion 414 may include guide forms 456 that are to engage guide groves 455 in walls of the pin housing 450, which are to help prevent binding of the second coupler 413 as it is moved between the extended and retracted positions (see FIGS. 9A and 9B).

The bottom alignment pin 420 may include a third coupler 421 that may be to couple with a circular mounting hole 23_C, and a fourth coupler 423 that may be couple with a square mounting hole 23_S.

The third coupler 421 may include a hollow 422. The third coupler 421 may be similar to the first coupler 411 of the top alignment pin 410, in certain respects, and thus detailed description of certain features thereof is omitted. The third coupler 421 may differ from the first coupler 411 in that the third coupler 421 has the rack lock 440 extending generally horizontally through the hollow 422 (see FIGS. 8 and 10A-11B). In addition, the third coupler 421 has a gap 428 in its side such that the rack lock 440 may be moved into the gap 428 so as to hook onto a side of the mounting hole 23 (see FIGS. 8 and 10A-11B).

The fourth coupler 423 may include a base portion (not illustrated) (similar to the base portion 414) with guide forms (not illustrated) (similar to the guide forms 456), a first portion 426, a second portion 427, and a spring (not illustrated) (similar to the spring 429). The fourth coupler 423 may be similar to the second coupler 413 of the top alignment pin 410, in certain respects, and thus detailed description of certain features thereof is omitted. The fourth coupler 423 may differ from the second coupler 413 in that the first portion 426 and the second portion 427 of the fourth coupler 423 have a different arrangement than the first through fourth portions 416-419 of the second coupler 413. In particular, the first and second portions 426/427 of the fourth coupler 423 are concave and are located on top and bottom sides of the third coupler 421, respectively (see FIG. 8). The first and second portions 426/427 are such that the apexes 426-A/427-A thereof couple with top and bottom sides of a square mounting hole 23_S and left sides 426-L/427-L and right sides 426-R/427-R thereof couple with left and right sides of the square mounting hole 23_S. In other words, a distance $d_4$ is equal to a distance $d_5$, where $d_4$ is a distance between the apexes 426-A and 427-A and $d_5$ is a distance between the left side 427-L and the right side 427-R as well as a distance between the left side 426-L and the right side 426-R (see FIG. 10A).

The rack lock 440 may be to lock the front end of the bracket assembly 100 to the device rack 30 when the alignment pins 410/420 are coupled with the mounting holes 23 (see FIGS. 10A and 10B). In particular, the rack lock 440 may include a hook 441 that engages a side of one of the mounting holes 23 so as to constrain horizontal movement of the bracket assembly 100, while the alignment pins 410/420 constrain vertical movement of the bracket assembly 100 (see FIGS. 8, and 10A-11B). The rack lock 440 may be moveable between an unlocked position in which it does not engage the side of the mounting hole 23, and a locked position in which it does engage the side of the mounting hole 23. The rack lock 440 may be spring biased toward the locked position. The rack lock 440 may include a shaft 442 that extends from a chamber defined by a lock housing 460, the side wall 114, and the pin housing 450 through the hollow 422 and forward out of the third coupler 421 (see FIG. 11B). The rack lock 440 may include a release button 443 connected to the shaft 442, that may be pressed to move the rack lock 440 toward the unlocked position (see FIGS. 11A and 11B). The spring biasing of the rack lock 440 may be provided by the shaft 442. In particular, the shaft 442 may be connected to the side wall 114, bent, and cantilevered so as to provide the spring biasing and so as to convert movement of the release button 443 in the outward direction into movement of the hook 441 in the inward direction.

The release button 443 may be accessible by a user through a button access hole 470 in the side wall 114. The button access hole 470 may include a finger catch 471 that is designed so as to engage a rearward facing side of the user's finger as the finger presses the release button 443, thereby providing positive resistance against the user's finger if the finger is pulled in the rearward direction while simultaneously depressing the button 443. In particular, the finger catch 471 may be formed by a rearward side of the button access hole 470 and may be located within 4 mm of the rearward edge of the button 443. The finger catch 471 may be curved so as to better conform to a shape of a user's finger.

The front attachment 400 also may include a cover latch 430. The cover latch 430 may extend horizontally forward from within the chamber defined by the pin housing 450 out though the front wall 117 (see FIGS. 8 and 10A-11B). The cover latch 430 may be located between the top alignment pin 410 and the bottom alignment pin 420. When the rail kit 10 is installed in the device rack 20, the cover latch 430 may extend through one of the mounting holes 23 and may form part of a latching mechanism that is to latch a cover 24 (see FIG. 13B) that may be installed across a front opening of the device rack 20. For example, the cover latch 430 may include hook at a distal end thereof that may be to engage with a complementary portion of the cover 24 so as to achieve the aforementioned latching.

The bracket assembly 100 also may include a rear attachment 500, which may be formed from a rear end of the rear bracket 120 and alignment pins 510 (see FIGS. 1, 2, and 3B). The rear attachment 500 attaches to a rear column 22 of the device rack 20 by coupling the alignment pins 510 with mounting holes 23. The alignment pins 510 include two portions with different diameters, which may allow them to couple with either circular or square mounting holes 23.

Figure 6C:
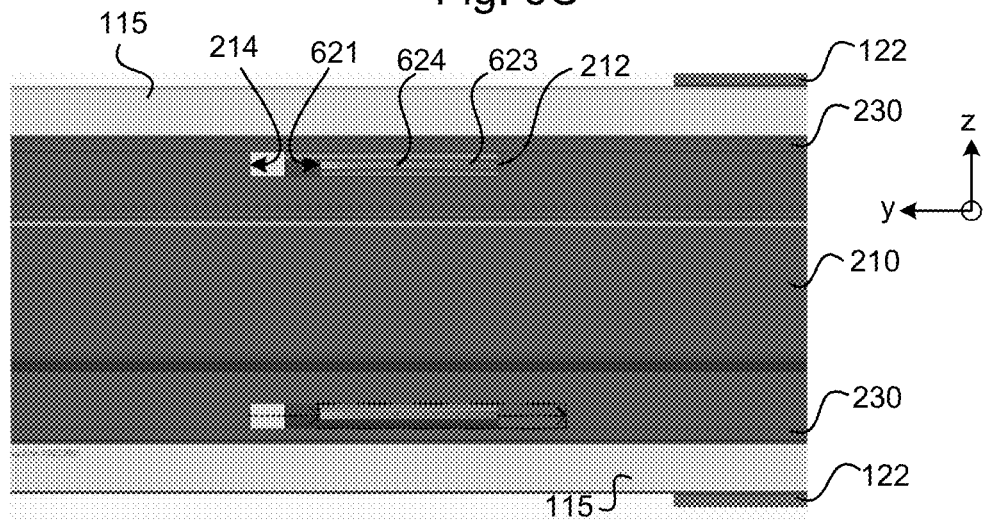
FIG. 6C is an elevation view of a portion of an interior facing side of an example rail kit in a state in which an example installation lock is locking the middle rail.

The bracket assembly 100 also may include an installation lock 600. The installation lock is partially visible in FIGS. 1, 2, 3B, 7B, and 7C. Additional details of the installation lock 600 are illustrated in FIG. 6A, in which the installation lock 600 is shown separate from other features of the rail kit 10 for clarity. In addition, FIGS. 6B and 6C illustrate enlarged portions of the rail kit 10 to show details related to a locked state of the installation lock 600. The installation lock 600 may include a shaft 610, a locking protrusion 620 that extends perpendicularly from the shaft 610, and a manual release 630 (see FIG. 6A). The installation lock 600 may be connected to an outward face of the side wall 114 in the groove formed by the central ridge thereof in the rearward portion 111 of the front bracket 110 (for example via mechanical fasteners), with the locking protrusion 620 extending inwardly from the shaft 610 toward the side wall 114 (see FIGS. 3B and 7B). The locking protrusion 620 extends into a hole 635 in the side wall 114, and moves inward and outward between a locked position (see FIG. 7C) and an unlocked position (see FIG. 7B), the locking protrusion 620 being spring biased inwardly toward the locked position by the shaft 610. In the locked position, the locking protrusion 620 extends through the hole 116 and beyond an inward face of the side wall 114 sufficiently far that it lockingly engages the second depression 212 of the middle rail 200 when the middle rail 200 is in the first position and the inner rail 300 is not engaged by the middle rail 200 (see FIG. 7C). In the unlocked position, the locking protrusion 620 is moved outwardly from the locked position sufficiently far that it no longer lockingly engages the second depression 212 of the middle rail 200 (FIG. 7B). Although only one locking protrusion 620 is described for simplicity, as can be seen in FIGS. 6A, 6C, and 7A-7C, in some examples the installation lock 600 may include more than one locking protrusion 620 to engage with more than one second depressions 212.

In particular, the locking protrusion 620 may include a forward edge 621, a rearward edge 622, a top edge 623 that may be curved, and an apex 624 (see FIG. 6A). The forward edge 621 has a height $h_1$, which may be sufficiently high that at least part of the forward edge 621 extends into the second depression 212 of the middle rail 200 when in the locked position. This allows an edge 214 of the second depression 212 to engage the forward edge 621 and thereby prevent rearward movement of the middle rail 200 (i.e., lock the middle rail). Specifically, as can be seen from considering FIGS. 6A-C and 7C, if the middle rail 200 is slid rearward from its position in FIG. 6C, the edge 214 will come into contact with the forward edge 621 because the forward edge 621 extends into the depression 212, thus preventing further rearward movement of the middle rail 200 (the dashed-line rectangle in FIG. 6C represent the location of the bottommost second depression 212 when the edge 214 contacts the forward edge 621). Because the locking protrusion 620 is spring biased inwardly toward the locked position, when the middle rail 200 is moved forward to the first position such that the second depression 212 is aligned with the locking protrusion 620, the locking protrusion 620 automatically moves into the second depression 212 and locks the middle rail 200.

In addition, the height $h_1$ may be sufficiently low that when the inner rail 300 is engaged by and slides rearward in the middle rail 200, the forward edge 621 does not contact the inner rail 300. In addition, a height $h_2$ of the apex 624 may be sufficiently high that when the inner rail 300 is engaged by and slides rearward in the middle rail 200, the inner rail 300 contacts the top edge 623 at some point between the forward edge 621 and the apex 624. Because the top edge 623 may be curved, when the inner rail 300 contacts the top edge 623 as the inner rail 300 slides rearward, the force exerted by the inner rail 300 pushes the locking protrusion 620 outward toward the unlocked position until the forward edge 621 is no longer within the second depression 212 of the middle rail 200. At this point, the locking of the middle rail 300 by the installation lock 600 is automatically released, and the middle rail 300 becomes free to move rearward.

A height $h_3$ of the rearward edge 622 may be sufficiently low that the rearward edge 622 does not contact that middle rail 200, even when in the locked position. Thus, in such examples, when the installation lock 600 locks the middle rail 200, rearward horizontal motion of the middle rail 200 may be constrained by the installation lock, but forward horizontal motion of the middle rail 200 may not be constrained.

In particular, if a thickness of the side wall 114 near the second depression 212 is A and if a thickness of the side wall 210 near the second depression 212 is 8, then in certain examples $A<h_1<(A+B)$, $h_2>[(A+B)+(h_1-A)]$, and $h_3<A$.

The manual release 630 may include a lip that is raised relative to the shaft 610 (see FIG. 6A). The manual release 630 may allow a user to manually release the locking of the installation lock 600 by engaging the manual release 630 so as to pull the end of the shaft 610 outward.

The rail kit 10 also may include an extended rail lock 700. The extended rail lock 700 is partially visible in FIGS. 2, 7A, and 7B. Additional details of the extended rail lock 700 are shown in FIG. 5B, in which the extended rail lock 700 is shown as attached to the inner rail 300. In addition, FIGS. 12A and 12B illustrate enlarged portions of the rail kit 10 to show details related to a locked state of the extended rail lock 700. The extended rail lock 700 may include a shaft 710 that is attached at both ends to the side wall 310 of the inner rail 300 (see FIG. 5B). The shaft 710 may be positioned on an outward face of the side wall 310 in a central ridge thereof (see FIG. 5B). The shaft 710 may include an elevated portion 711 and two spring biasing portions 712 on opposite ends of the elevated portion 711, the spring biasing portions 712 angling outwardly away from the side wall 310 such that the elevated portion 711 may be elevated relative to an outward facing side of the side wall 310 (see FIGS. 5B and 12B).

The extended rail lock 700 also may include a locking protrusion 720, which has a forward edge 721 and a rearward edge 722 (see FIG. 12B). The locking protrusion 720 moves between a locked position and an unlocked position, and may be spring biased outwardly by the spring biasing portions 712 toward the locked position. The locking protrusion 720 may be to move into the locked position and lockingly engage with the first depression 211 of the middle rail 200 when the inner rail 300 is extended to a fully extended position, and thereby constrain horizontal movement of the inner rail 300 in both the forward and rearward directions. In particular, the forward edge 721 and the rearward edge 722 have heights that are sufficiently large that, when in the locked position and when the inner rail 300 is extended to a fully extended position, both the forward edge 721 and the rearward edge 722 extend into the first depression 211 of the middle rail 200 such that edges of the first depression 211 constrain horizontal movement of the inner rail 300 by contact with the forward edge 721 or the rearward edge 722 (see FIG. 12B). The forward edge 721 and the rearward edge 722 are such that when in the unlocked position they do not extend into the first depression 211 of the middle rail 200, and thus do not constrain horizontal movement of the inner rail 300.

The extended rail lock 700 also may include a release button 730 on the elevated portion 712, that when pressed inwardly causes the elevated portion 711 of the shaft 710 to move inwardly, thereby causing the locking protrusion 720 to move to the unlocked position, thereby releasing the locking of the inner rail 300. The distance between the elevated portion 711 and the side wall 310 may be sufficiently large that it is possible for the locking protrusion 720 to be moved to the unlocked position by pressing the release button 730 inward. In particular, a distance between the elevated portion 711 and the side wall 310 should be greater than a height of the forward edge 721 or a height of the rearward edge 722 of the locking protrusion 720.

The rail kit 10 also may include a second extended rail lock 800. The second extended rail lock 800 may include a shaft 810 that may be attached to the side wall 114 of the front bracket 110. The shaft 810 may be attached to an outward face of the side wall 114 in a central ridge thereof. The shaft 810 may include a locking protrusion 820 that extends inwardly through a hole 801 in the side wall 114 and that has a forward edge, a rearward edge, and a top edge. The locking protrusion 820 moves between a locked position and an unlocked position, and may be spring biased inwardly by the shaft 810 toward the locked position. The locking protrusion 820 may be to move into the locked position and lockingly engage with the third depression 213 of the middle rail 200 when the middle rail 200 is extended to a fully extended position, and thereby constrain horizontal movement of the middle rail 200 in both the forward and rearward directions. In particular, the forward edge 821 and the rearward edge 822 may have heights that are sufficiently large that, when in the locked position and when the middle rail 200 is extended to a fully extended position, both the forward edge 821 and the rearward edge 822 extend into the third depression 213 of the middle rail 200 such that edges of the third depression 213 constrain horizontal movement of the middle rail 200 by contact with the forward edge 821 or the rearward edge 822. The top edge 823 of the locking protrusion 820 may be curved and may have a height at its apex such that when the inner rail 300 slides rearward into the middle rail 200, the inner rail 300 contacts the top edge 823 of the locking protrusion 820 and thereby pushes the locking protrusion 820 outward toward the unlocked position resulting in automatically releasing the locking of the middle rail.

Above, a "fully extended position" of the middle rail 200 and a "fully extended position" of the inner rail 300 were described. These positions may be arbitrarily set by adjusting the location at which the extended rail lock 700 attaches to the inner rail 300, the location at which the second extended rail lock 800 attaches to the front bracket 110, and/or the locations of the first and/or third depressions 211/213 of the middle rail 200.

In general, the fully extended position of the middle rail 200 may be forward of the first position relative to the bracket assembly 100, but may be not so far forward that the capability of the bracket assembly 100 to vertically support the device 30 (via the inner rail 300 and the middle rail 200) is compromised. In certain examples, the fully extended position of the middle rail 200 may be such that at least ⅓ of the length of the middle rail 200 is still engaged by the front bracket 110 when the middle rail 200 is at the fully extended position. In certain examples, the fully extended position may be set such that the middle rail 200 has at least 300 mm of horizontal travel relative to the bracket assembly 100 between a fully retracted position and the fully extended position. In certain examples, the fully extended position may be set such that no more than ¾ of the middle rail 200 is still engaged by the front bracket 110 when the middle rail 200 is at the fully extended position.

In general, the fully extended position of the inner rail 300 may be forward of its fully retracted position relative to the middle rail 200, but may be not so far forward that the capability of the middle rail 200 to vertically support the device 30 (via the inner rail 300) is compromised. In certain examples, the fully extended position of the inner rail 300 may be such that at least ⅓ of the length of the inner rail 300 is still engaged by the middle rail 200 when the inner rail 300 is at the fully extended position. In certain examples, the fully extended position may be set such that the inner rail 300 has at least 300 mm of horizontal travel relative to the middle rail between a fully retracted position and the fully extended position. In certain examples, the fully extended position may be set such that no more than ¾ of the inner rail 300 is still engaged by the middle rail 200 when the inner rail is at the fully extended position.

In certain examples, the fully extended position of the middle rail 200 and the fully extended position of the inner rail 300 are mutually set such that a total travel of the inner rail 300 relative to the bracket assembly is at least 600 mm. In certain examples, the fully extended position of the middle rail 200 and the fully extended position of the inner rail 300 are mutually set such that a total travel of the inner rail 300 relative to the bracket assembly is no more than 715 mm.

As used herein and in the appended claims, "horizontal" and/or "horizontally" refer to directions that are parallel to a longitudinal dimension of the bracket assembly, whereas "vertical" and/or "vertically" refer to directions that are perpendicular to the horizontal. In FIGS. 1-13, "horizontal" directions are parallel to the y-axis, while "vertical" directions are parallel to the z-axis. Thus, both $+\hat{y}$ and $-\hat{y}$ directions may be "horizontal", and both $+\hat{z}$ and $-\hat{z}$ directions may be "vertical". When one of the example rail kits is installed in a device rack, the "horizontal" directions may be parallel to a line extending between corresponding mounting holes in opposing columns of the device rack, and the "vertical" directions may be parallel to a direction in which the columns extend. Horizontal movement or extension is movement or extension in any horizontal direction, whereas vertical movement or extension is movement or extension in any vertical direction.

As used herein and in the appended claims, "forward" refers to an orientation that is aligned with a horizontal vector pointing from a rear of the bracket assembly toward a front of the bracket assembly, while "rearward" refers to an orientation that is aligned with a horizontal vector pointing from a front of the bracket assembly toward a rear of the bracket assembly. In FIGS. 1-13, "forward" is aligned with the $+\hat{y}$ direction, while "rearward" is aligned with the $-\hat{y}$ direction. When one of the example rail kits is installed in a device rack, the "forward" orientation may be aligned with a vector extending from a rear column of the device rack to a front column of the device rack, and vice-versa for the "rearward" orientation. Forward movement or extension is movement or extension in a forward oriented direction, whereas rearward movement or extension is movement or extension in a rearward oriented direction.

As used herein and in the appended claims, "inward" refers to an orientation that is aligned with a vector that would point from the rail kit toward the electronic device if the electronic device were mounted to the rail kit. As used herein and in the appended claims, "outward" refers to an orientation that is the opposite of the "inward" orientation (i.e., an orientation that is aligned with a vector that would point away from the electronic device if the electronic device were mounted to the rail kit). "Inward" and "outward" for one rail kit will not necessarily be identical to "inward" and "outward" for another rail kit, since the different rail kits may be oriented differently from one another. For example, when a pair of rail kits is installed in a device rack, they may be facing each other, and thus "inward" for one of the rail kits may be pointing in an opposite direction as "inward" for the other one of the rail kits. For example, in FIGS. 1-13, "inward" is aligned with the +x̂ direction for the left-side rail kit 10L, and with the −x̂ direction for the right-side rail kit 10R. Similarly, "outward" is aligned with the −x̂ direction for the left-side rail kit 10L and the +x̂ direction for the right-side rail kit 10R. Inward movement or extension is movement or extension in an inward oriented direction, whereas outward movement or extension is movement or extension in an outward oriented direction.

As used herein and in the appended claims, a first element may be to "couple" with a second element if the first element is capable of extending into an opening defined by the second element.

As used herein and in the appended claims, a first element may be considered to "prevent movement" of a second element in some specified direction if the first element constrains the second element such that it cannot move in the specified direction beyond some point; however, this does not imply that the first element necessarily has to keep the second element from any and all movement in the specified direction. In other words, when it is said that some element "locks" another element, this does not mean that it completely prevents all movement of the element, but rather that it sets some constraint on movement. For example, when it is said that the extended lock 700 prevents the inner rail 300 from moving in both the forward direction and the rearward direction when it is in the locked position, this means that the extended lock 700 constrains the movement of the inner rail 300 in the forward and rearward directions to be within some finite range of positions; however, the extended lock 700 does not necessarily prevent the inner rail 300 from all forward and rearward motion and the inner rail 300 may move forward and rearward freely within the finite range. This reflects the fact that some finite tolerance or "wiggle room" may be inevitable due to manufacturing variances. In addition, in certain examples some finite tolerance or "wiggle room" may be intentionally included in the design to facilitate smooth functioning of the locking mechanism.

As used herein and in the appended claims, a first element is "connectable" to a second element if the first element is so configured that it is capable of being connected to the second element; however, this does not require that the first element actually be connected to the second element. For example, in the example rail kit 10 the inner rail 300 may not be connected to any electronic device initially, but the inner rail 300 is nonetheless still "connectable" to an electronic device even in this state because the inner rail 300 is so configured that it could be connected to an electronic device.

As used herein and in the appended claims, a first element is "engagable" by a second element if the first element is so configured that it is capable of being engaged by the second element; however, this does not require that the first element actually be engaged by the second element. For example, in the example rail kit 10 the inner rail 300 may not be engaged by the middle rail 200 initially, but the inner rail 300 is nonetheless still "engagable" by the middle rail 200 even in this state because the inner rail 300 is so configured that it could be engaged by the middle rail 200.

The foregoing describes example rail kits. While the above disclosure has been shown and described with reference to the foregoing examples, it should be understood that other forms, details, and implementations may be made without departing from the spirit and scope of this disclosure.

What is claimed is:

1. A rail kit, comprising:
a bracket assembly that is attachable to opposing columns of a device rack;
a middle rail that is engaged by the bracket assembly such that the middle rail is vertically supported and horizontally slidable relative to the bracket assembly;
an inner rail that is:
connectable to an electronic device, and
engagable by the middle rail such that, when so engaged, the inner rail is vertically supported and horizontally slidable relative to the middle rail; and
a rail lock that includes a shaft and a locking protrusion extending inward from the shaft that includes a front edge and a top edge, the shaft being directly attached to an outer side of a bracket of the bracket assembly,
wherein the rail lock is such that, when the inner rail is not engaged by the middle rail and the middle rail is located at a first position that is forward of a fully retracted position, the rail lock enters a locked position in which:
the protrusion of the rail lock extends through a depression of the middle rail via a hole in the bracket such that the front edge prevents rearward movement of the middle rail by contacting a rim of the depression in the middle rail, and
the top edge is located at least in part on an inward side of the middle rail such that, if the inner rail were engaged by the middle rail and slid toward the retracted position, the inner rail would contact the top edge and force the rail lock into an unlocked position in which rearward movement of the middle rail is not prevented by the rail lock.

2. The rail kit of claim 1,
wherein the rail lock and the depression in the middle rail are located such that a front end of the middle rail is forward of a front end of the bracket assembly when the middle rail is at the first position.

3. The rail kit of claim 1,
wherein the bracket assembly is flared at a front end thereof.

4. The rail kit of claim 1,
wherein the bracket assembly includes a front attachment portion that includes an alignment pin that is to couple with a mounting hole of the device rack, and
the alignment pin includes:
a first coupler that has a cross-sectional exterior profile that is circular; and a second coupler that:
includes portions that are radially outward of the first coupler on at least a top, bottom, left, and right side thereof,
is horizontally slidable relative to the first coupler between an extended position and a retracted position, and
is spring biased toward the extended position.

5. The rail kit of claim 4,
wherein the first coupler includes a hollow portion along an axis thereof and is threaded to receive a screw in the hollow portion.

6. The rail kit of claim 4,
wherein the bracket assembly includes a housing that holds the alignment pin, and
the second coupler includes four guide forms that are to engage guide grooves in walls of the housing to guide the second coupler as it moves between the extended and retracted positions.

7. The rail kit of claim 4,
wherein the front attachment portion includes a second alignment pin that is to couple with a second mounting hole of the device rack and that includes:
a third coupler that has a cross-sectional exterior profile that is circular;
a fourth coupler that:
is horizontally slidable relative to the third coupler between an extended position and a retracted position,
is spring biased toward the extended position, and
includes a top portion and a bottom portion that are on top and bottom sides of the third coupler; and
a mounting latch that extends horizontally through a center of the third coupler, is moveable between a locked position and an unlocked position, and is to lock the bracket assembly to the device rack when in the locked position.

8. The rail kit of claim 7,
wherein the mounting latch includes a release button that is accessible via an access hole in a side of the bracket assembly, and
the bracket assembly includes a finger catch that is to engage a user's finger while the finger presses the release button.

9. The rail kit of claim 1,
further comprising a second rail lock that is connected to the inner rail and that is to, when the inner rail is engaged by the middle rail and the inner rail is slid to a second position, engage a second depression in the middle rail so as to lock the inner rail relative to the middle rail,
wherein the locking of the inner rail relative to the middle rail by the second rail lock prevents the inner rail from sliding in both a retracting direction and an extending direction.

10. The rail kit of claim 1,
wherein the protrusion is sized such that, when the rail lock is in the locked position, the front edge extends into the depression in the middle rail but does not extend far enough inward to contact the inner rail as the inner rail is slid toward the retracted position.

11. The rail kit of claim 1,
wherein the top edge of the protrusion is curved.

12. The rail kit of claim 11,
wherein an apex of the top edge is sufficiently higher than the front edge that, when the inner rail is in contact with the apex, the front edge no longer prevents rearward movement of the middle rail.

13. The rail kit of claim 1,
wherein the rail lock includes a manual release that is accessible from an outward side of the bracket assembly.

14. A rail kit, comprising:
a bracket assembly that is attachable to opposing columns of a device rack and that supports a number of rails;
wherein the bracket assembly includes a front attachment portion that includes an alignment pin that is to couple with a mounting hole of the device rack, and
the alignment pin includes:
a first coupler that has a cross-sectional exterior profile that is circular; and
a second coupler that:
includes four protruding portions that extend from a base portion, are physically separated from one another, and are radially outward of the first coupler on at least a top, bottom, left, and right side thereof, respectively,
is horizontally slidable relative to the first coupler between an extended position and a retracted position, and
is spring biased toward the extended position.

15. The rail kit of claim 14,
wherein the first coupler is to couple with the mounting hole when the mounting hole is circular; and
the second coupler is shaped so as to couple with the mounting hole when the mounting hole is square and to be pressed by the device rack into the retracted position while the first coupler is coupled with the mounting hole when the mounting hole is circular.

16. The rail kit of claim 14,
wherein the front attachment portion includes a second alignment pin that is to couple with a second mounting hole of the device rack and that includes:
a third coupler that has a cross-sectional exterior profile that is circular;
a fourth coupler that:
is horizontally slidable relative to the third coupler between an extended position and a retracted position,
is spring biased toward the extended position, and
includes a top portion and a bottom portion that are on top and bottom sides of the third coupler; and
a locking hook that extends horizontally through a center of the third coupler, is moveable between a locked position and an unlocked position, and is to lock the bracket assembly to the device rack when in the locked position.

17. A rail kit, comprising:
a bracket assembly that is attachable to opposing columns of a device rack and that supports a number of rails;
wherein the bracket assembly includes a front attachment portion that includes an alignment pin that is to couple with a mounting hole of the device rack, and
the alignment pin includes:
a first coupler that has a cross-sectional exterior profile that is circular and that surrounds a hollow region along an axis thereof;
a second coupler that:
is slidable horizontally relative to the first coupler between an extended position and a retracted position,
is spring biased toward the extended position, and includes a first portion and a second portion that are concave and that are on opposing sides of the first coupler, respectively, and that are configured such that a width of the first portion equals a width of the second portion and equals a distance between an apex of the first portion and an apex of the second portion; and a locking hook that:
- extends horizontally from within the first coupler to beyond a front of the first coupler via the hollow region,
- is moveable between a locked position and an unlocked position,
- is spring biased toward the locked position, and
- is to lock the bracket assembly to the device rack when the alignment pin is coupled with the mounting hole and the locking hook is in the locked position.

18. The rail kit of claim 17, wherein the first coupler includes a gap at an end thereof, and the locking hook is located at least partially within the gap when in the locked position.

19. The rail kit of claim 17, wherein the locking hook includes a release button that is accessible from an outward side of the bracket assembly and moves the locking hook from the locked position to the unlocked position when depressed.

\* \* \* \* \*